United States Patent
Zyskowski

(10) Patent No.: US 7,236,914 B1
(45) Date of Patent: Jun. 26, 2007

(54) INTEGRATED AIRCRAFT FLIGHT DYNAMICS PREDICTION AND SIMULATION

(75) Inventor: Michael K. Zyskowski, Snohomish, WA (US)

(73) Assignee: Microsoft Corporation, Redmond, WA (US)

( * ) Notice: Subject to any disclaimer, the term of this patent is extended or adjusted under 35 U.S.C. 154(b) by 789 days.

(21) Appl. No.: 10/082,692

(22) Filed: Feb. 22, 2002

(51) Int. Cl.
*G09B 9/08* (2006.01)
*G09B 19/16* (2006.01)
*G06G 7/48* (2006.01)

(52) U.S. Cl. ................... 703/8; 703/7; 434/30; 701/3

(58) Field of Classification Search ............... 703/8, 703/7; 434/30; 701/3
See application file for complete search history.

(56) References Cited

U.S. PATENT DOCUMENTS

| | | | |
|---|---|---|---|
| 5,378,155 A * | 1/1995 | Eldridge | 434/411 |
| 6,246,929 B1 * | 6/2001 | Kaloust | 701/11 |
| 6,553,333 B1 * | 4/2003 | Shenk | 702/182 |
| 2004/0189671 A1 * | 9/2004 | Masne | 345/619 |

OTHER PUBLICATIONS

Haines, "The contribution of aerodynamics to advances in transport aircraft design", Phys. Technol., vol. 13, 1982.*
Cooke et al., "NPSNET: Flight simulation dynamic modeling using quaternions", In Presence, vol. 1, No., pp. 404-420.*
Hannemann et al., "Visualization of High Speed Aerodynamic Configuration Design", Proceedings of the 6th IEEE Visualization Conference, 1995.*
Trapp et al., "Data Level Comparative Visualization in Aircraft Design", IEEE, 1996.*
Reed et al., "Improving the Aircraft Design Process Using Web-Based Modeling and Simulation", ACM Transactions on Modeling and Computer Simulation, vol. 10, No. 1, Jan. 2000, pp. 58-83.*
Lu et al., "Manufacturing process modeling of Boeing 747 moving line concepts", Proceedings of the 2002 Winter Simulation Conference.*
Zyskowski, Michael K. "Aircraft Simulation Techniques Used in Low-Cost, Commerical Software." AIAA Modeling and Simulation Technologies Conference and Exhibit. Aug. 11-14, 2003. Austin, Texas. http://fsinsider.com/articles/aircraftsimulation.com.*
"SDK Overview" of Microsoft Flight Simulator 98 (FS98). Undated.*

(Continued)

*Primary Examiner*—Paul Rodriguez
*Assistant Examiner*—Ayal Sharon
(74) *Attorney, Agent, or Firm*—Lee & Hayes, PLLC

(57) ABSTRACT

In a flight simulator program, a flight dynamics editing module enables the user to input parameters for modifying an existing aircraft design or creating an aircraft design. Starting with the type and purpose of aircraft, the user is able to specify parameters defining the configuration, and various other aspects of the aircraft, including the number and type of engines, properties of the flight controls, type of landing gear, etc. Once the user has input the parameters, an aerodynamic coefficients generator module included with the flight simulation program determines aerodynamic coefficients for the aircraft design, using classical formulas and determining the coefficients in an appropriate order. The aerodynamic coefficients and certain parameters input by the user are then output as two flight model data files, in a format usable by the flight simulator program, so that the user can evaluate the aircraft design by flying it within the simulation.

34 Claims, 18 Drawing Sheets

OTHER PUBLICATIONS

"Microsoft Flight Simulator 2000 Software Development Kit, Aircraft Container System." Mar. 2000.*
"Setting and Changing Aircraft Parameters: Software Development Kit #1" of Microsoft Combat Flight Simulator 2.0. Nov. 29, 2000.*
"Importing Aircraft, Missions, and Scenery for Combat Flight Simulator 2". Jan. 18, 2001.*
"Microsoft Flight Simulator 2004, A Century of Flight—Flight Simulator 2002 Software Developer Kits". © 2005 Microsoft Corporation. Printed from Internet on Jun. 14, 2006.*
Cooke et al., "NPSNET: Flight simulation dynamic modeling using quaternions", In Presence, vol. 1, No., pp. 404-420, Jan. 25, 1994.*
Hannemann et al., "Visualization of High Speed Aerodynamic Configuration Design", Proceedings of the 6th IEEE Visualization Conference, 1995.*
"Airplane PDQ now Supports X-Plane Flight Simulator: Fly Your Dream Plane Today." Press Release, Sep. 14, 2001. DaVinci Technologies, Incorporated. Laurel, MD. 1 pg.
"A Brief History of Microsoft Flight Simulator." n.d., 2 pp. Available http://web.ukonline.co.uk/dmarch/fshistory.htm.
"Flight Shop." n.d., 1 pg. Available http://web.ukonline.co.uk/dmarch/flight_shop.htm.
"How to add aircraft to FS2000, FS98, FS95 and FS5.x." n.d., 3 pp. Available http://home.onet.co.uk/~rdavis/fs/help/aircraft.htm.
"About FS Design Studio Developer Pages." n.d. 1 pg. Available http://www.fsdesignstudio.com/about.htm.
"Research and Technical Information." American Institute of Aeronautics and Astronautics, Inc. 2001. 4 pp.
"EASY5 Aerospace Library Sample Models." Boeing Corporation. n.d., 1 pg. Available http://www.boeing.com/assocproducts/easy5/libraries/aerospace_lib/aerospace_models.html.
"Aircraft Design: Flight Shop." n.d., 1 pg. Available http://www.geocities.com/CapeCanaveral/5173/adesign.html.
"Flight Simulators: A Look at Linux in the Aerospace Training Industry." Linux Journal.1999:64es, Aug. 1999. 3 pp. Available http://portal.acm.org/citation.cfm?id=327942&coll=portal&dl=ACM&CFID=999318&CFTOKEN=86173694.
"International conference on Industrial and engineering applications of artificial intelligence and expert systems." Proceedings of the second international conference on Industrial and engineering applications of artifical intelligence and expert systems. 1989. 2 pp. Available http://portal.acm.org/citation.cfm?id=67323&coll=portal&dl=ACM&CFID=999318&CFTOKEN=86173694.
"Communications of the ACM." 43:7. Jul. 2000, 2 pp. Available http://portal.acm.org/citation.cfm?id=341861&coll=portal&dl=ACM&CFID=999318&CFTOKEN=86173694.
"Aircraft and Flight Simulator Links." Oct. 18, 2001. 2 pp. Available http://www.daviator.com/links.htm.
"CRRCSim: A Model-Airplane Flight Simulation Program." n.d., 1 pp. Available http://crrcsim.sourceforge.net/.
"Boeing JSF Modeling and Simulation Breakthroughs Reduce Program Risk, Cost." Oct. 4, 2001. 2 pp. Available http://www.boeing.com/news/releases/2001/q4/nr_011004n.htm.
"Boeing Completes Demonstration of Full Mission Simulation for Joint Strike Fighter." Dec. 9, 1997. 2 pp. Available http://www.boeing.com/news/releases/1997/news_release_971209n.html.
"Aircraft Factory 99." AVSIM Commerical Review. Review by P. Paschutine: *Full Throttle Magazine.* 1999. 5pp. Available http://www.avsim.com/pages/0999/abacus/af99.shtml.
About X-Plane: Description. Printed Feb. 14, 2002. http://www.x-plane.com/descrip.html .. Website design by TheBettsBro., Inc. 5pp.
Airplane Design, Analysis & Drafting Software. Printed Feb. 14, 2002. http://www.darcorp.com/Software/software.htm DARcorporation. 4pp.
DaVinci Technologies Makers of AirplanePDQ™. Printed Feb. 14, 2002. http://www.davincitechnologies.com/AirplanePDQ.htm DaVinci Technologies, Incorporated. 6pp.

* cited by examiner

INTEGRATED AIRCRAFT FLIGHT DYNAMICS PREDICTION AND SIMULATION

FIELD OF THE INVENTION

The present invention generally relates to designing or modifying an aircraft design for use in a flight simulator software program, and more specifically, relates to software and a method that enable a user to design or modify a design of an aircraft by specifying a plurality of parameters, and then generate aerodynamic coefficients to enable the user to fly the aircraft within the flight simulator program, to evaluate the performance of the aircraft design.

BACKGROUND OF THE INVENTION

Flight simulation software has always been among the more popular of the personal computer game genres. The quality of the flight simulation and the realism of the graphics for the aircraft and the scenery around the simulated aircraft continue to improve with each new version of the flight simulator programs, and as a result of the increased speed of graphic display adapter cards and processors. One of the more popular programs of this type is FLIGHT SIMULATOR 2002™, which is produced and distributed by Microsoft Corporation. This program enables a novice to learn to fly by providing instruction in various aspects of flying and by simulating the presence of an instructor in the cockpit, for purposes of demonstrating flying principles and expertise and explaining how to pilot an aircraft. The user can choose between various types of aircraft, including Boeing Corporation's 747-400, 737-300, and 777-400 commercial jet aircraft, several models of Cessna aircraft (including a floatplane version), a Learjet 45 business jet, a Bell 206B JetRanger III helicopter, a Sopwith Camel, and a Schweizer 2-32 sailplane. Multi-player capability and features related to the multi-player aspect of the software enable interaction with other participants over the Internet (or other network) while flying a simulation.

While the variety of aircraft that are provided in the FLIGHT SIMULATOR 2002™ program and other flight simulator programs are relatively extensive, the more dedicated flight simulator hobbyist will likely want to modify an existing design and eventually create his/her own aircraft design, and then test the design by flying it within the flight simulation program. Many parameters controlling an aircraft's design affect how it will fly (or even if it will fly). Therefore, it is important that an appropriate flight dynamics editing program provide a relatively user-friendly interface to enable these parameters to be efficiently selected by a user. Once the user has created a design or modified an existing design for an aircraft by choosing specific parameters, another program module must then implement the design by generating flight model data for the aircraft, based on the selected parameters. To enable the user to test the flight characteristics of the design in the flight simulation program, the flight model data that are thus generated must be in a form that is compatible with the flight simulator program. For example, FLIGHT SIMULATOR 2002™ requires that the flight model data for an aircraft be provided in an aircraft.air file and an aircraft.cfg file (where the italicized word "aircraft" in the name of the "aircraft.air" file is replaced with a specific word or phrase identifying the aircraft). The aircraft.air file includes binary data that define aerodynamic coefficients and non-linear tables of data for an aircraft, while the aircraft.cfg file includes parameters other than flight data, such as specification of the type and design of the landing gear and scaling factors that are to be applied to the aerodynamic data.

Earlier versions of Microsoft Corporation's FLIGHT SIMULATOR™ program included an add-on program called "FLIGHT SHOP™" that enabled some editing of the parameters for an aircraft design, but it is not usable with the FLIGHT SIMULATOR 2002 program, since the add-on program produces only a single data file that is not compatible with the current flight simulator program.

An alternative flight simulator program called X-PLANE™, as described on the X-PLANE web page (http://www.x-plane.com/descrip.html), "reads in the geometric shape of any aircraft and then figures out how that aircraft will fly. It does this by an engineering process called 'blade element theory,' which involves breaking the aircraft down into many small elements and then finding the forces on each little element many times per second. These forces are then converted into accelerations which are then integrated to velocities and positions." The X-PLANE program is sold with an additional program called PLANE MAKER™ that enables a user to enter the dimensions of the aircraft, which are then processed by the program to determine how the plane will fly. However, X-PLANE determines how the plane will fly using "blade element theory," which is not as accurate with respect to the forces or stability characteristics of a complete aircraft as the more classical design approach in which the forces of each of the various aircraft components are determined based on the equations of motion and Newtonian physics.

This classical technique is disclosed in connection with a software program called AIRPLANE PDQ™, which as described on the web page for this product (http://www.davincitechnologies.com/AirplanePDQ.htm) is "a conceptual/preliminary design tool for light homebuilt and general aviation aircraft. In AIRPLANE PDQ™, a CAD program is employed for producing airplane drawings of an aircraft." The user enters specific parameters and chooses from among several aircraft configuration options, such as high wing, low wing, tricycle gear, or tail-dragger. Sizing calculations are carried out, and an initial three-view drawing of the aircraft is produced based on the user's input. Interactive analysis is employed to verify the design's performance and to determine any changes to the design required for safety or to meet other criteria. However, this product is intended to facilitate the design of an actual aircraft and does not produce flight model data that can be employed in a flight simulator program to evaluate the flying characteristics of the design that was created.

Software products such as those produced by DARCorporation (web site at http://www.darcorp.com/Software/software.htm), are available to facilitate the design of commercial aircraft, based on the determination of lift and other aerodynamic properties for each component of an aircraft design. However, such products are again unable to produce flight model data for an aircraft that can be used to test the aircraft flight dynamics in a real-time flight simulation. It is particularly important that a product be able to produce data that are compatible with a widely respected and available flight simulator program, such as Microsoft Corporation's FLIGHT SIMULATOR 2002™, since the value of creating and testing a design is best appreciated in a flight simulator with which the user is most familiar.

Accordingly, it will be apparent that there was a substantial need to develop a feature for use in a flight simulation program such as FLIGHT SIMULATOR 2002 that would enable a user to create an aircraft design, generate compatible aircraft data based on the classic development of aerodynamic characteristics of the design, and then test the flying characteristics of the design in the flight simulation program. None of the other prior art programs noted above provide the full desired functionality or produce flight model data that are compatible with the FLIGHT SIMULATOR 2002™ program.

SUMMARY OF THE INVENTION

The present invention enables a user to create or modify a design for an aircraft and evaluate the flight characteristics of the design by flying the aircraft in a flight simulation program. In a preferred embodiment, a user runs an editing module that enables the user to input a plurality of parameters to define the design of the aircraft or modify an existing design. These parameters include geometric properties of the aircraft, which are processed by a module that generates a plurality of aerodynamic coefficients defining flight model data stored in files for the design of the aircraft. The flight model data files also include certain of the parameters input by the user. The aerodynamic coefficients can be used to determine the lift provided by the surfaces of components of the aircraft. The flight simulator program then employs the flight model data files to enable the user to simulate flying the aircraft that was designed or modified, so that the user can evaluate the flight characteristics of the design.

Limits are associated with at least some of the parameters, to prevent the user from entering a value for a parameter that is out of acceptable bounds. An indication is provided if the user attempts to enter a parameter that is outside the allowed limits associated with a parameter, so that the user can fix the problem. The editing module can even exclude entry of a parameter that is outside the allowed limits associated with a critical parameter.

One of the flight model data files used by the flight simulation program includes binary data defining the aerodynamic coefficients for component surfaces of the aircraft. Another flight model data file includes at least some of the plurality of parameters input by the user that do not directly affect the flight characteristics of the aircraft, such as an instrument panel configuration for the aircraft, or sounds experienced when simulating flying of the aircraft.

An important feature of the present invention is that it generates the aerodynamic coefficients in an appropriate order. Since certain of the aerodynamic coefficients rely on others of the aerodynamic coefficients in the technique used to produce the flight model data, the order in which these coefficients are generated is important. For example, the aircraft lift curve slope must be generated by the module before it can determine the static longitudinal stability of a design.

Another aspect of the present invention is directed to a memory medium on which are stored machine instructions for carrying out the steps of the method. Yet another aspect of the present invention is directed to a system for enabling a user to create or modify a design for an aircraft and evaluate flight characteristics of the design. The system includes a memory for storing machine instructions, a display, an input device, and a processor that is coupled to the memory, the display, and the input device. The processor executes the machine instructions stored in the memory and the machine instructions cause the processor to carry out functions that are generally consistent with the steps of the method described above.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

Figure 3A:
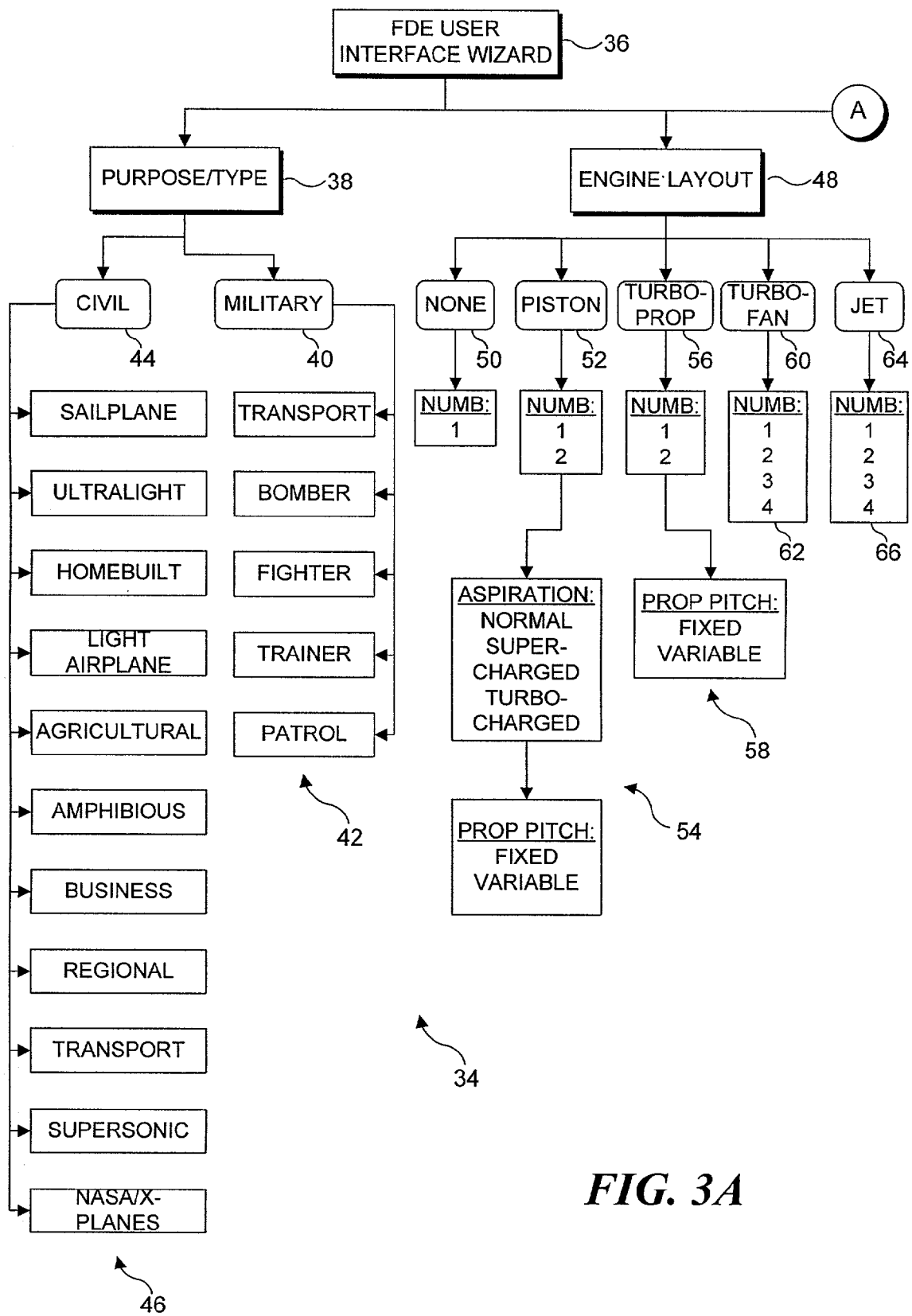
Figure 3B:
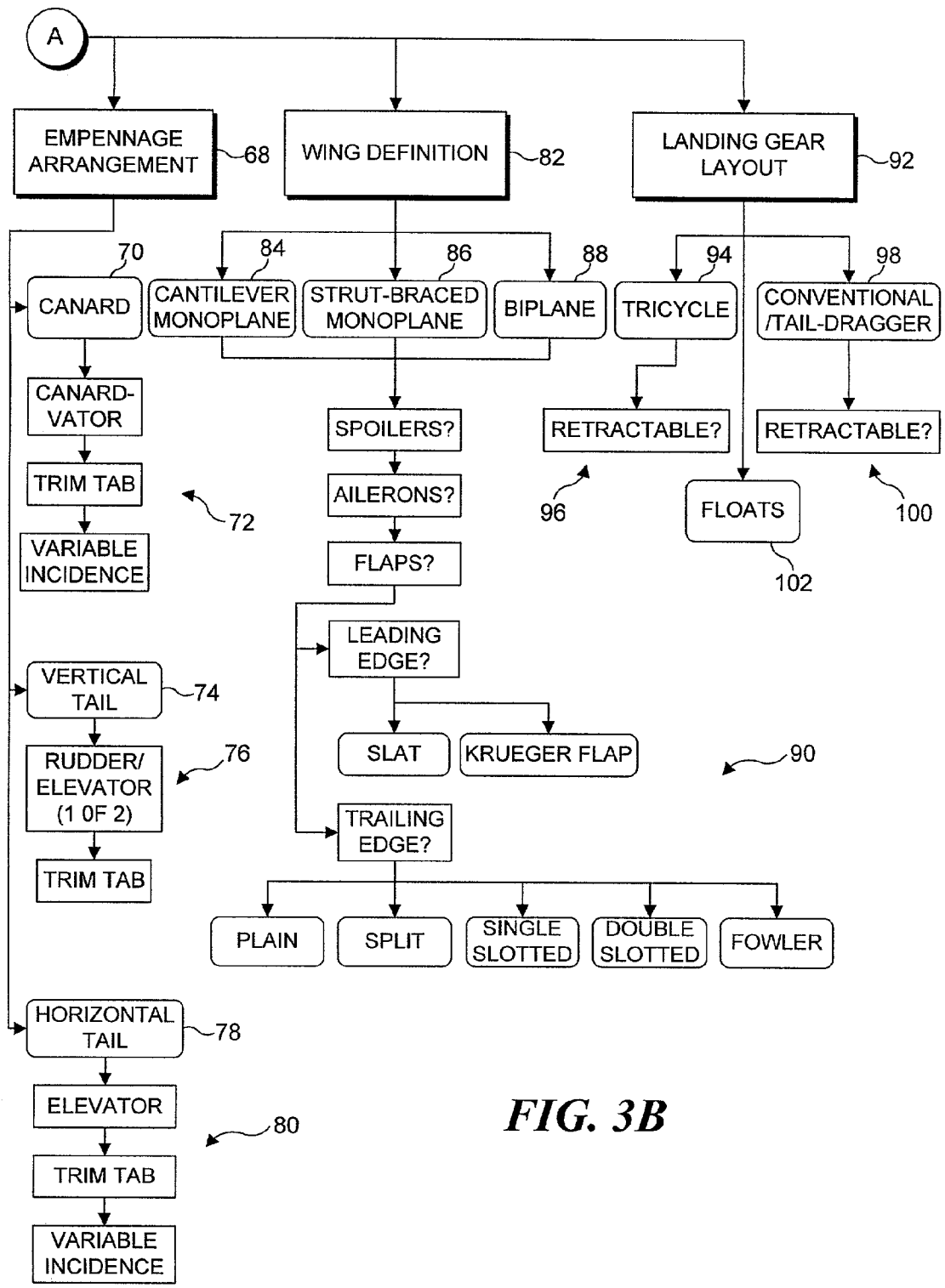
Figure 4:
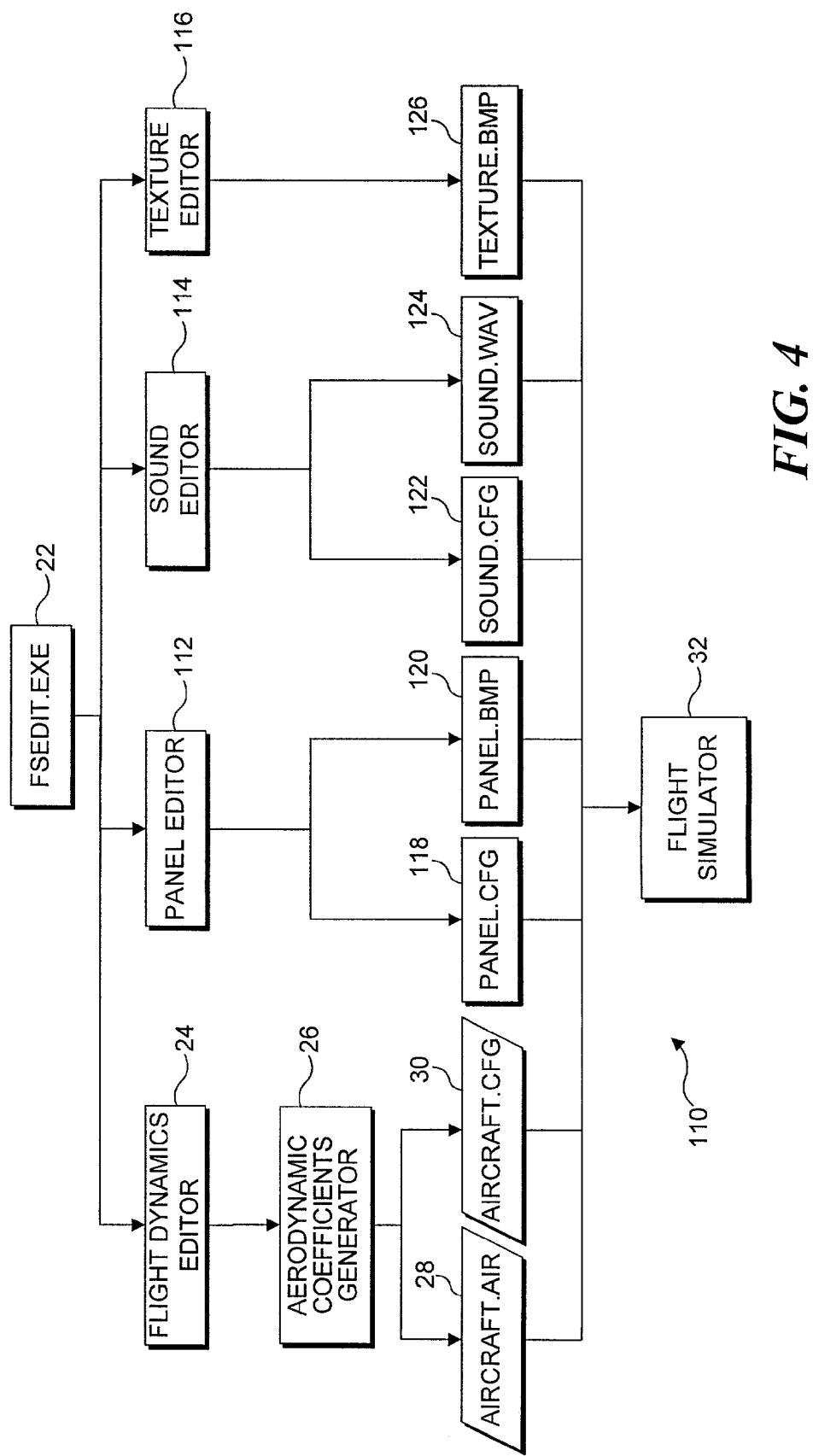
Figure 5:
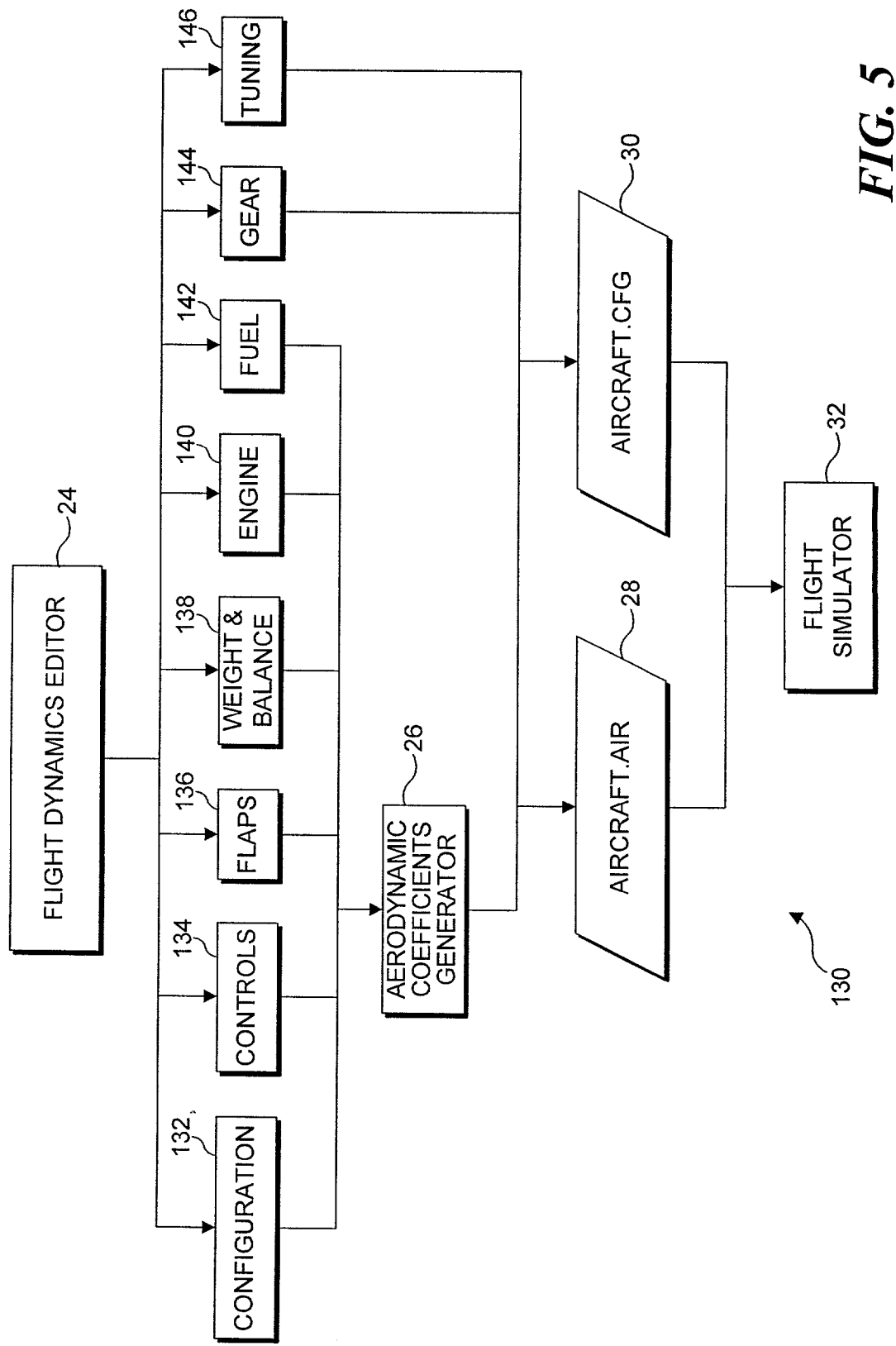
Figure 6:
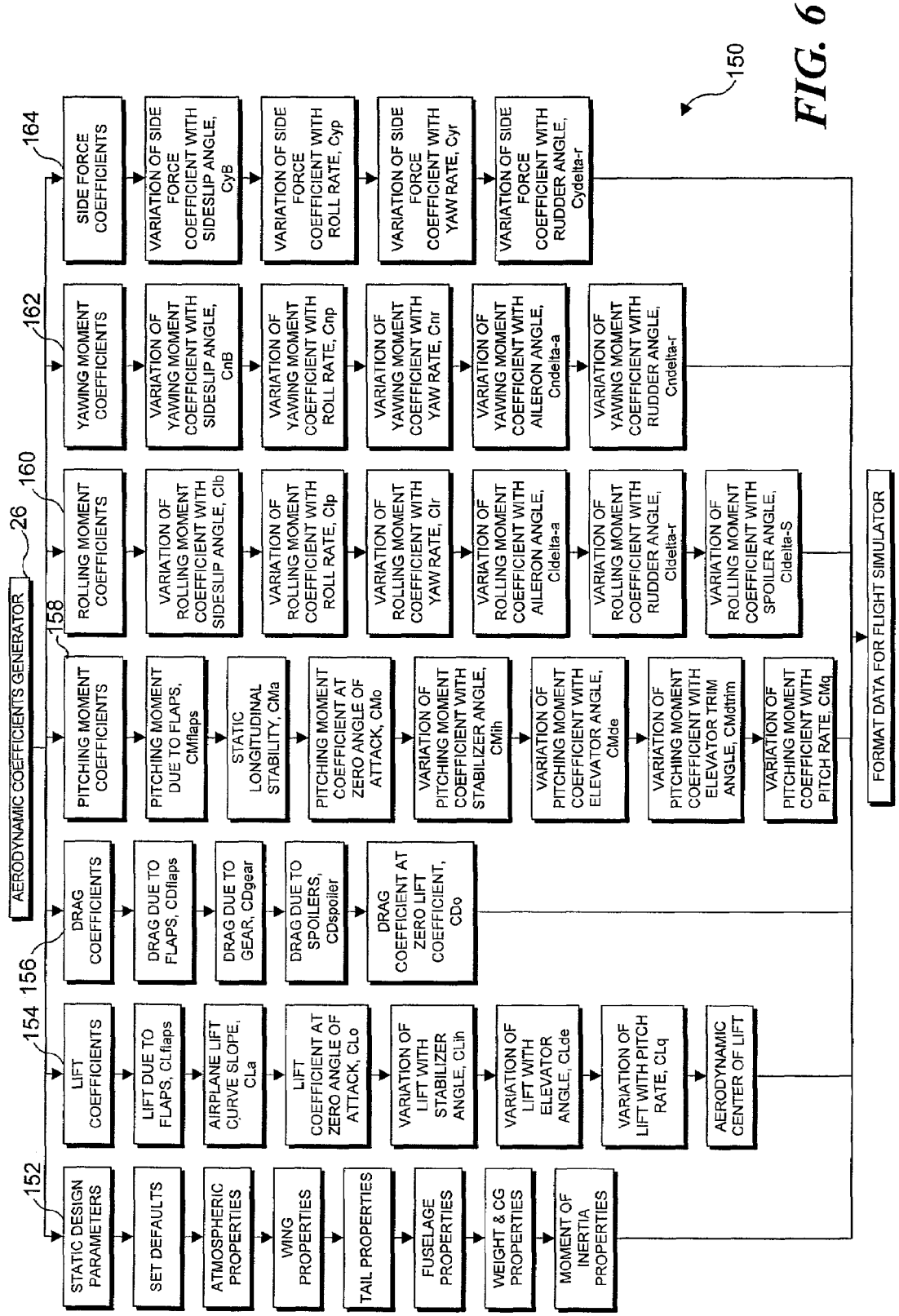
Figure 8:
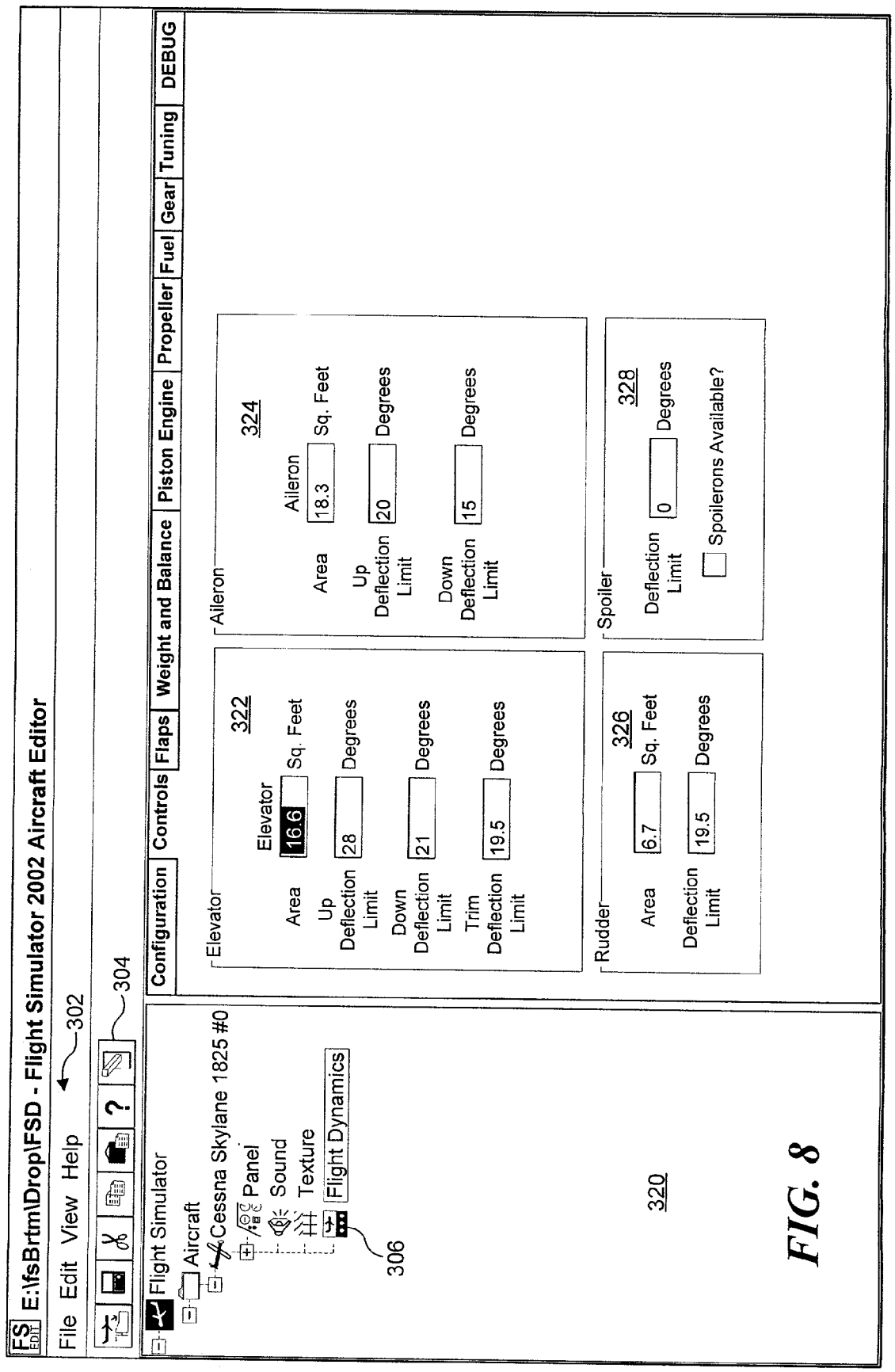
Figure 9:
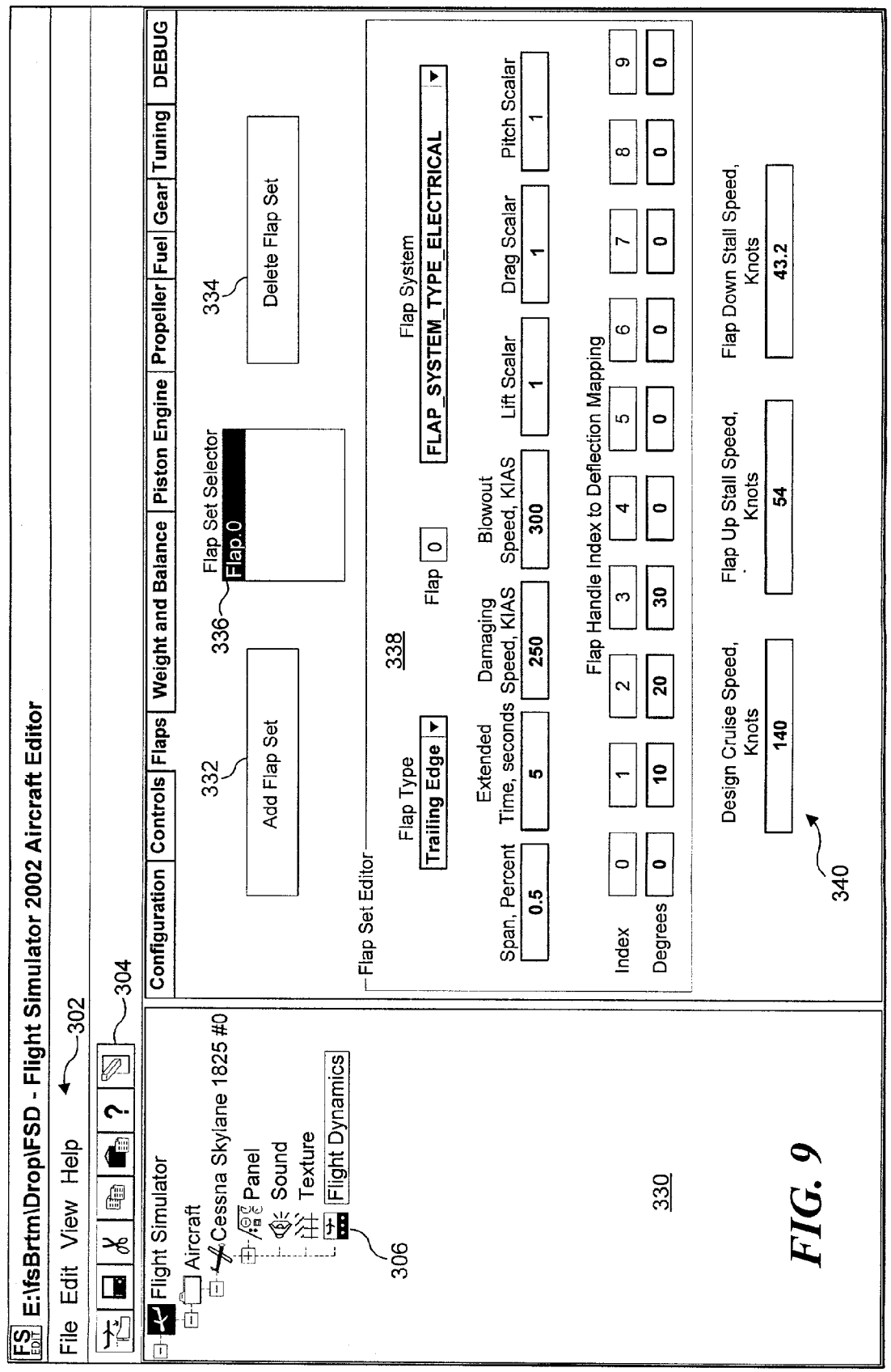
Figure 10:
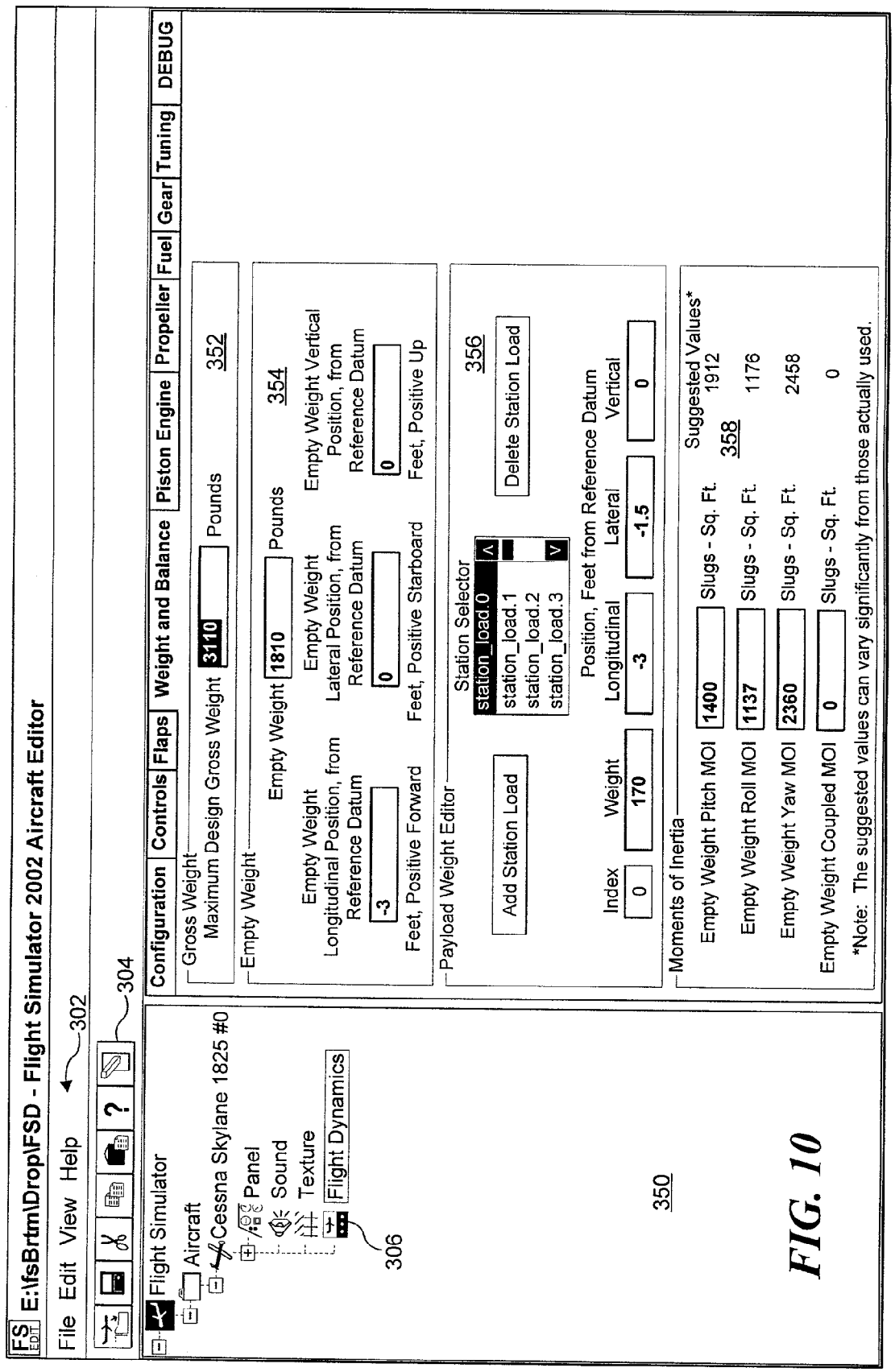
Figure 12:
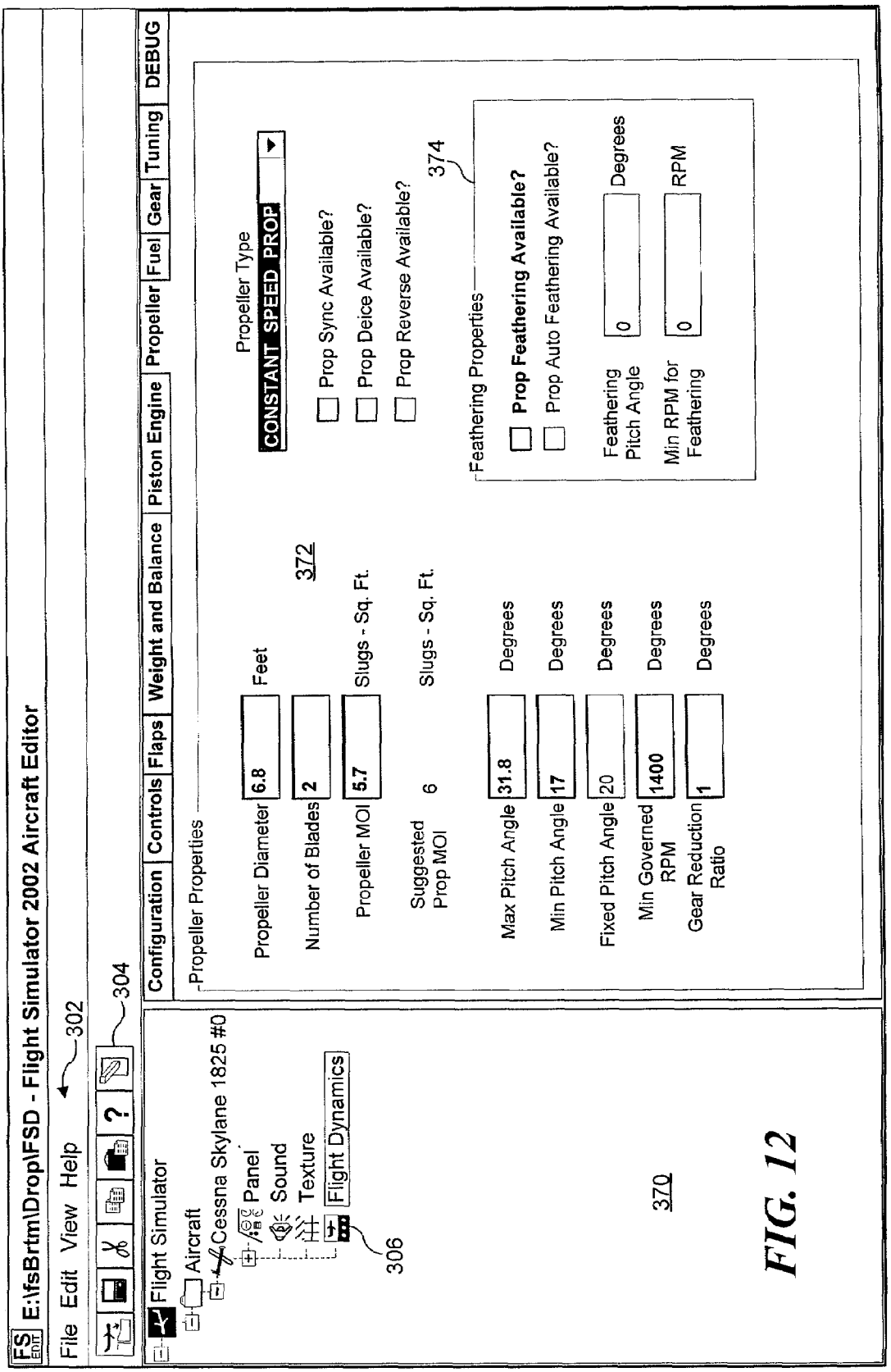
Figure 13:
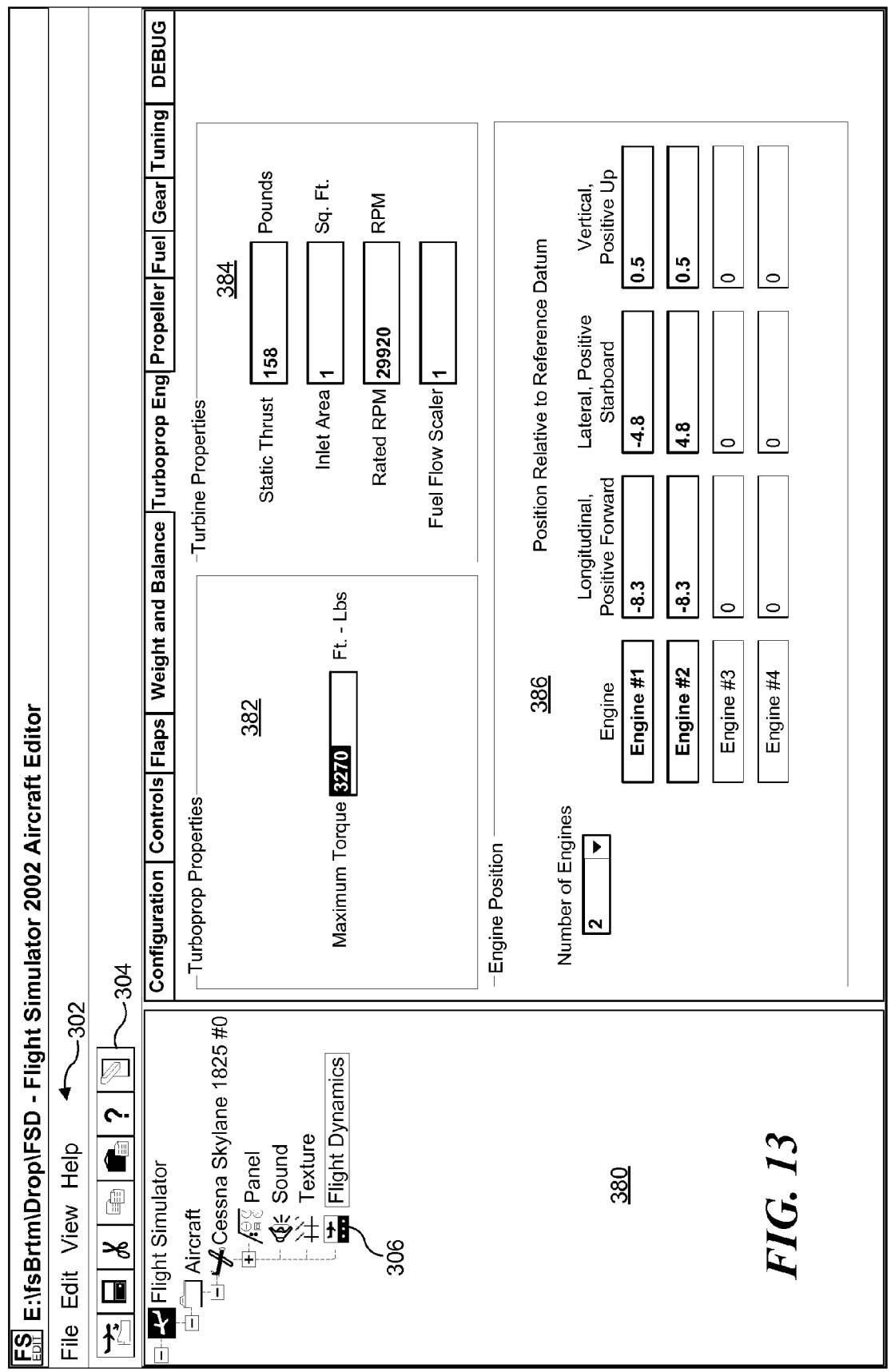
Figure 15:
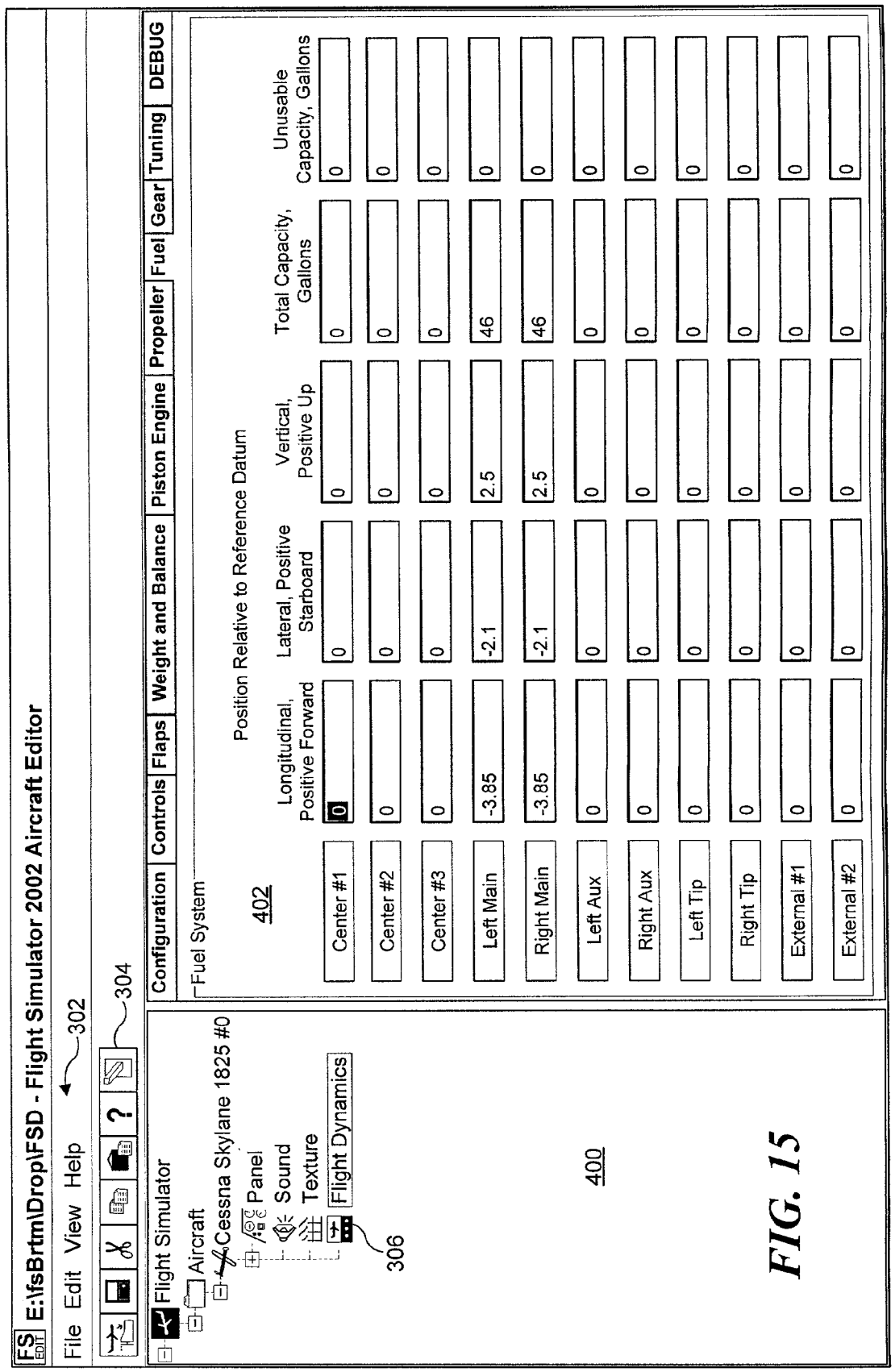
Figure 16:
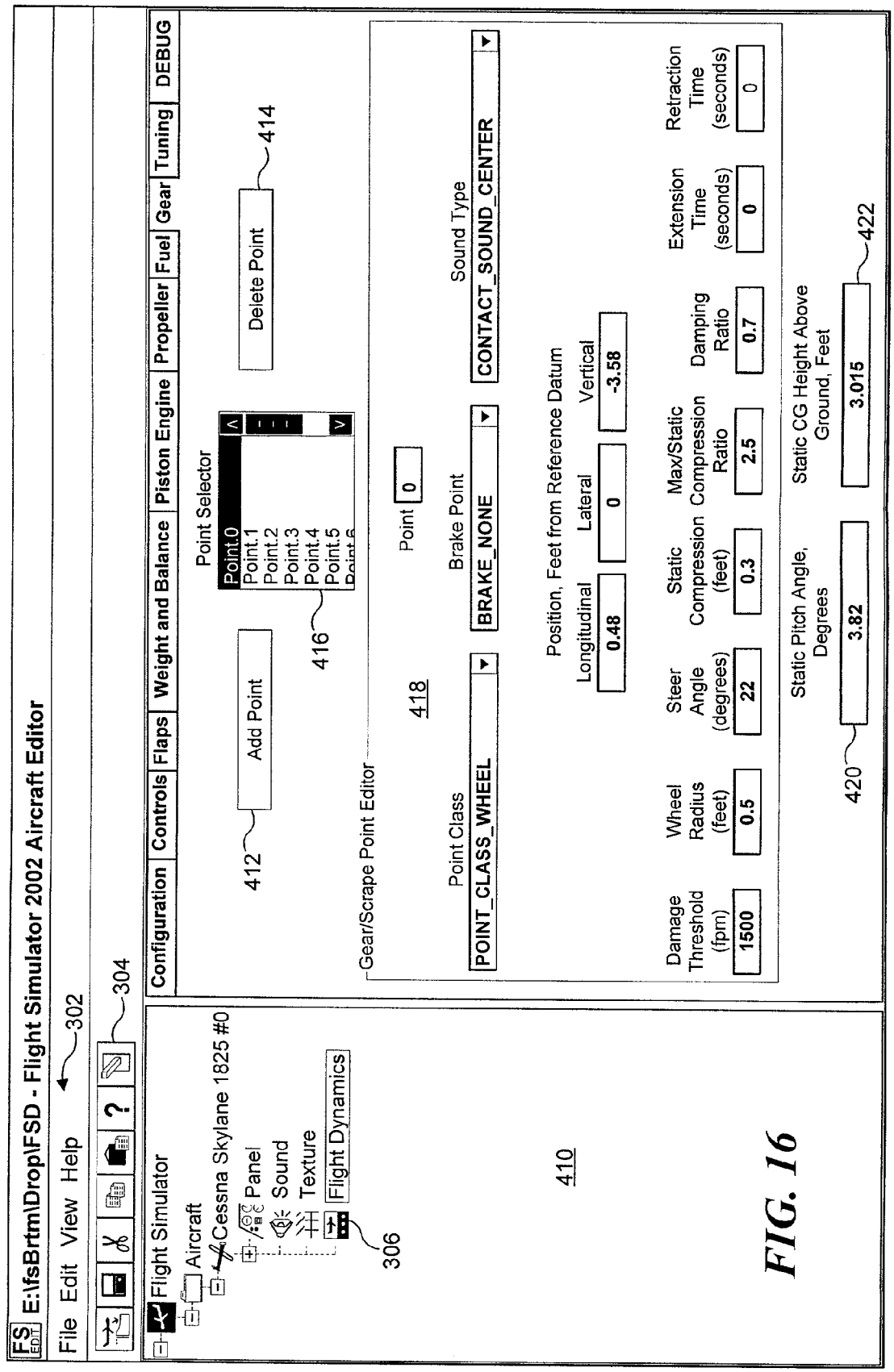
Figure 17:
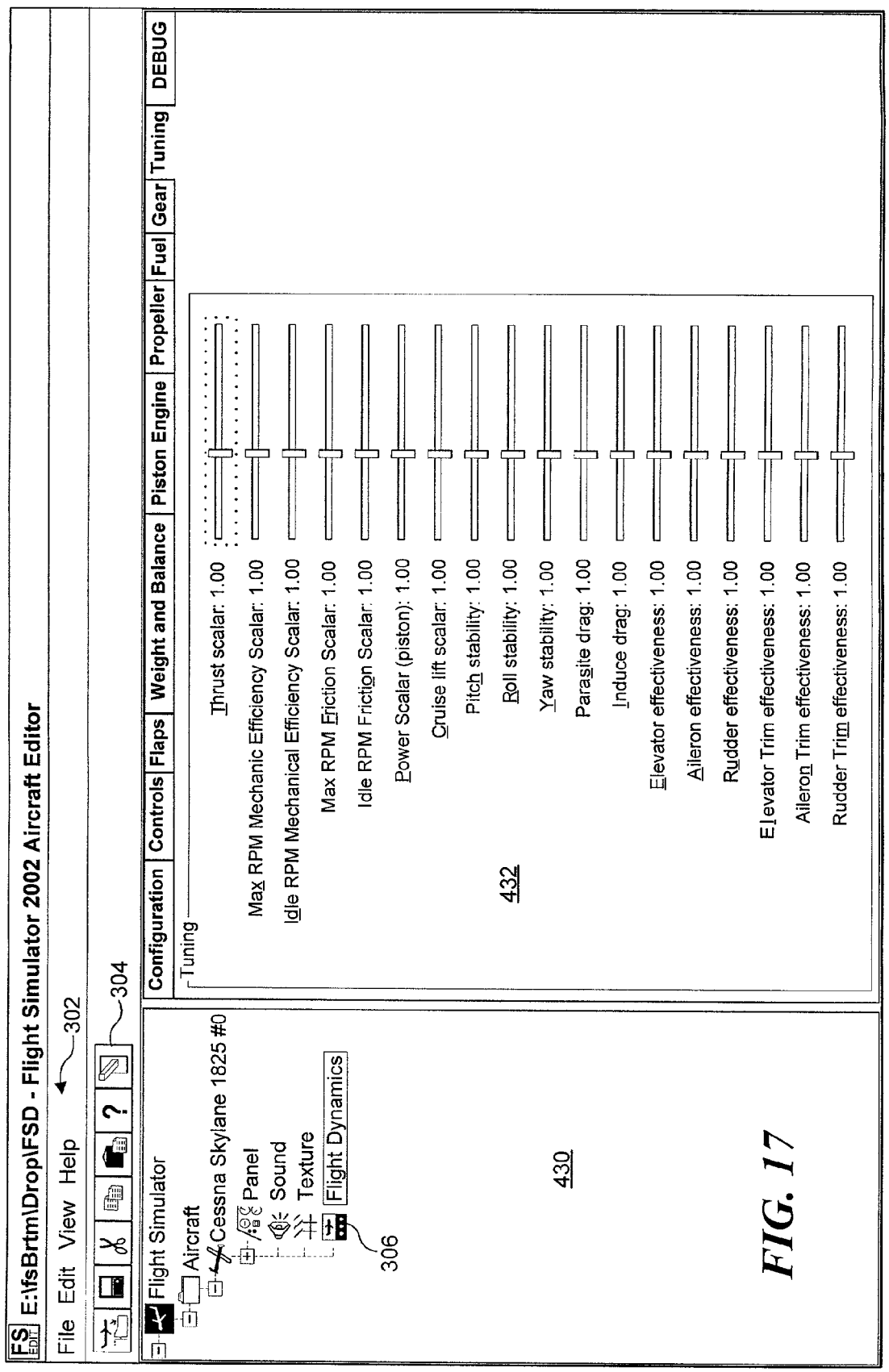

FIGS. 3A and 3B together illustrate a block diagram showing the various parameters that a user can select in creating a design of an aircraft or in modifying an existing design of an aircraft, in accord with a preferred embodiment of the present invention;

FIG. 4 is a block diagram illustrating the functional editing components of the flight simulator editing module, and showing the data that are produced for use by the flight simulator program;

FIG. 5 is a block diagram illustrating the aircraft component parameters that contribute to the two flight model files used by the flight simulator program;

FIG. 6 is a block diagram illustrating the aerodynamic coefficients generated by the aerodynamic coefficients generator module;

Figure 7:
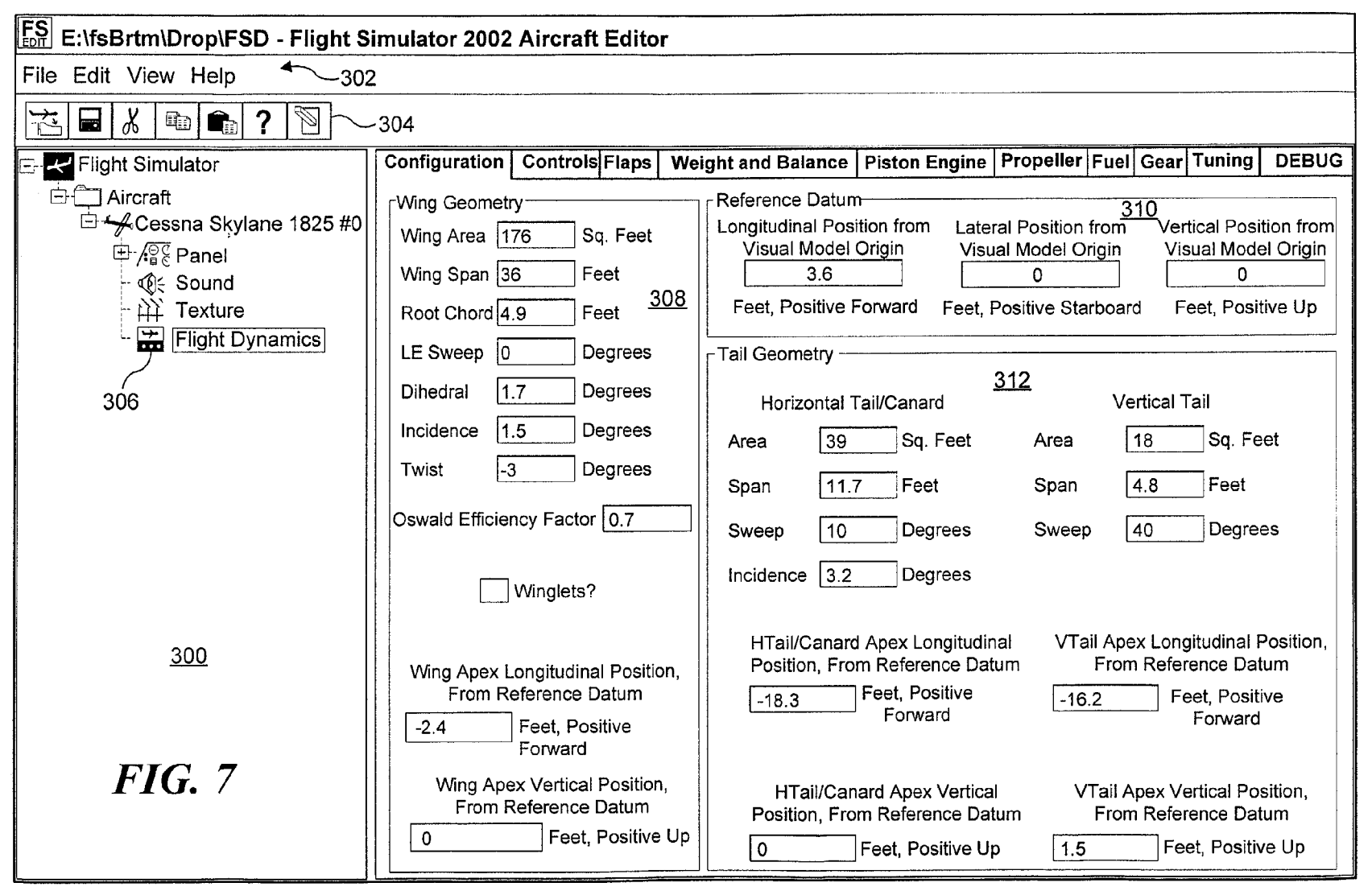

FIG. 7 is an exemplary dialog window provided in the editing module to enable a user to enter configuration parameters for an aircraft;

FIG. 8 is an exemplary dialog window enabling a user to enter control (elevator, aileron, rudder, and spoiler) parameters for an aircraft;

FIG. 9 is an exemplary dialog window enabling a user to enter flap parameters for an aircraft;

FIG. 10 is an exemplary dialog window enabling a user to enter weight and balance parameters for an aircraft;

Figure 11:
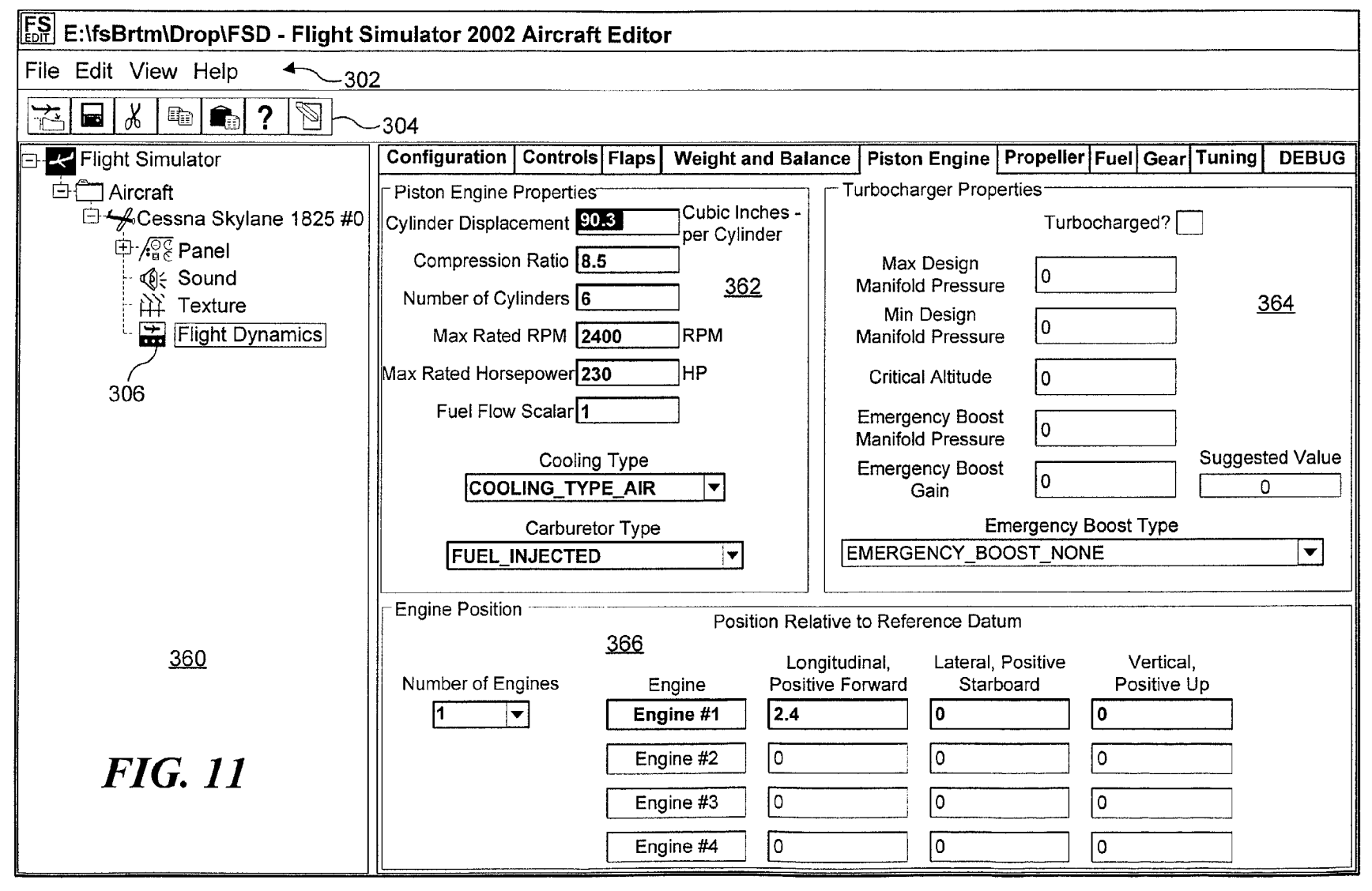

FIG. 11 is an exemplary dialog window enabling a user to enter piston engine parameters for an aircraft;

FIG. 12 is an exemplary dialog window enabling a user to enter propeller parameters for an aircraft;

FIG. 13 is an exemplary dialog window enabling a user to enter turboprop parameters for an aircraft;

Figure 14:
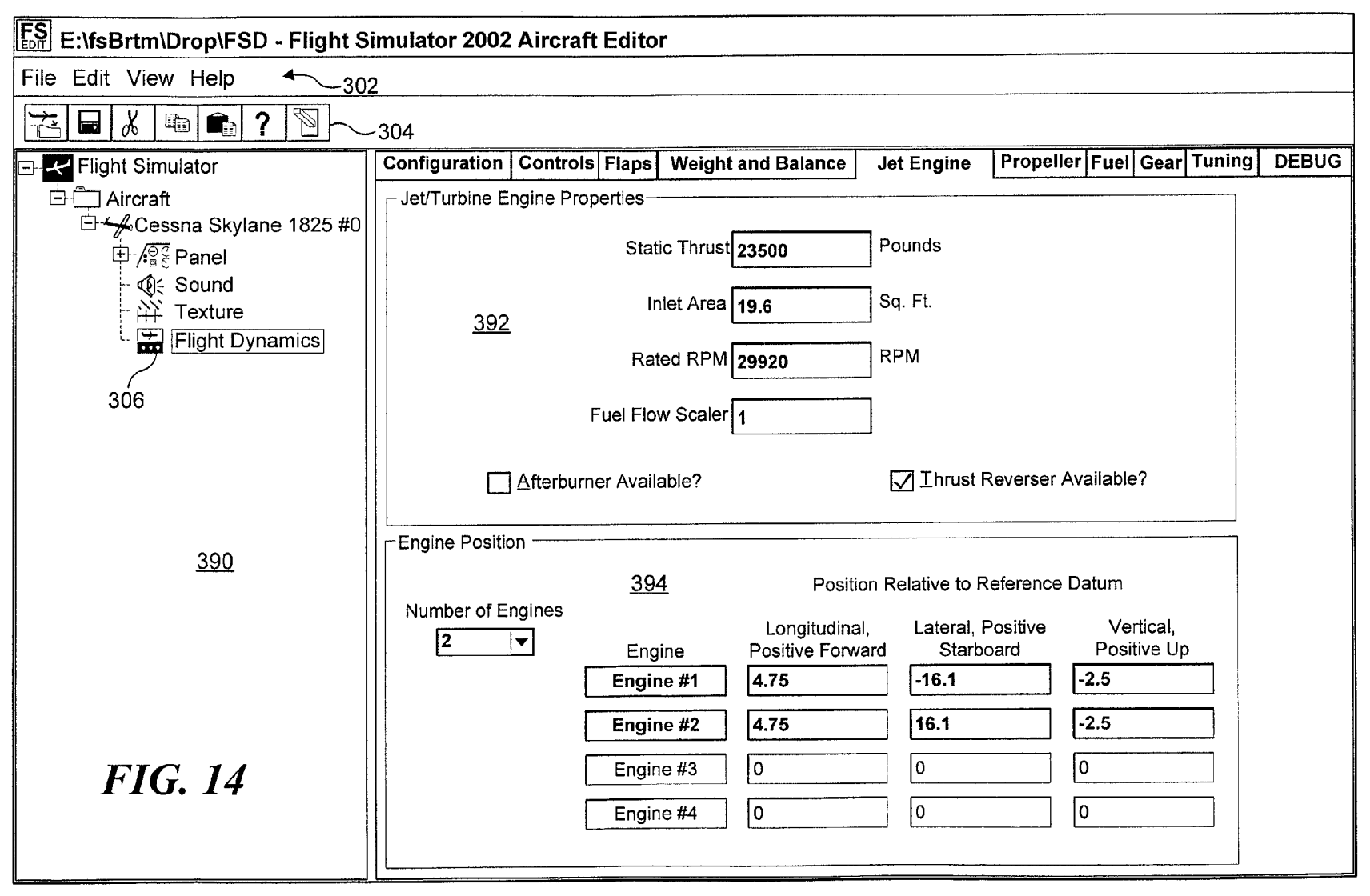

FIG. 14 is an exemplary dialog window enabling a user to enter jet engine parameters for an aircraft;

FIG. 15 is an exemplary dialog window enabling a user to enter fuel system parameters for an aircraft;

FIG. 16 is an exemplary dialog window enabling a user to enter landing gear parameters for an aircraft; and FIG. 17 is an exemplary dialog window enabling a user to set tuning parameters for an aircraft.

DESCRIPTION OF THE PREFERRED EMBODIMENT

Exemplary Operating Environment

Figure 1:
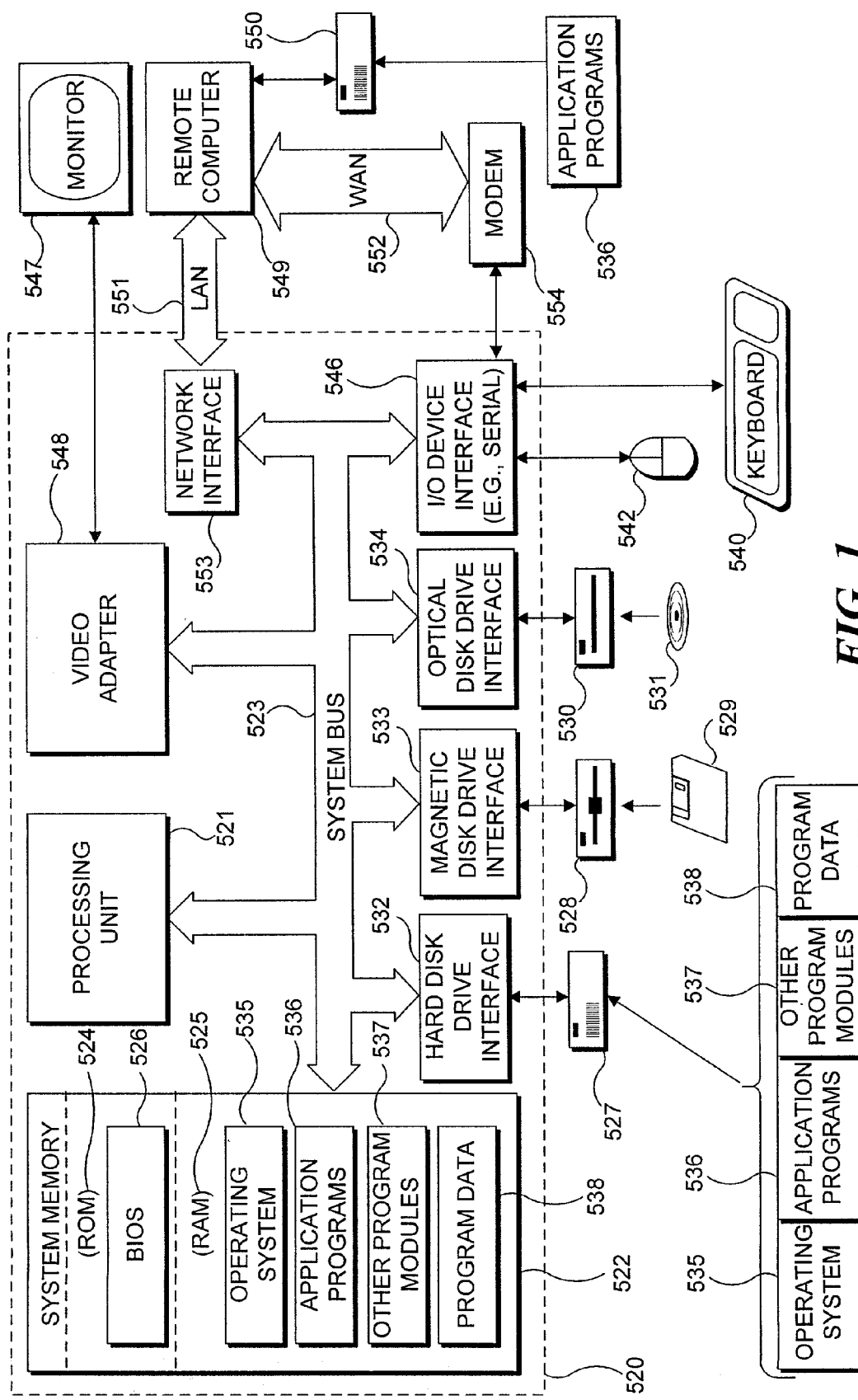
FIG. 1 is a block diagram of an exemplary system for implementing the present invention using a general purpose computing device in the form of a conventional personal computer (PC)

FIG. 1 and the following discussion are intended to provide a brief, general description of a suitable computing environment in which the present invention may be implemented. The invention will often be practiced on a single computing device, but can also be implemented on a client computing device and/or a server or other remote computing device connected by a communication network, both of which will typically include the functional components shown in FIG. 1. Although not required, the present invention will be described in the general context of computer executable instructions, such as program modules that are executed by a PC. Generally, program modules include application programs, routines, objects, components, functions, data structures, etc. that perform particular tasks or implement particular abstract data types. Also, those skilled in the art will appreciate that this invention might also be practiced with other computer system configurations, such as a client device for executing personal productivity tools, including hand-held devices, pocket personal computing devices, other microprocessor-based or programmable consumer electronic devices, multiprocessor systems, network PCs, minicomputers, mainframe computers, and the like. Furthermore, the present invention can also be practiced in distributed computing environments, where tasks are performed by remote processing devices that are linked through a communications network. In a distributed computing environment, program modules may be located in both local and remote memory storage devices.

With reference to FIG. 1, an exemplary system for implementing the present invention includes a general purpose computing device in the form of a conventional PC 520, provided with a processing unit 521, a system memory 522, and a system bus 523. The system bus couples various system components including the system memory to processing unit 521 and may be any of several types of bus structures, including a memory bus or memory controller, a peripheral bus, and a local bus using any of a variety of bus architectures. The system memory includes read only memory (ROM) 524 and random access memory (RAM) 525. A basic input/output system 526 (BIOS), containing the basic routines that help to transfer information between elements within the PC 520, such as during start up, is stored in ROM 524. The PC 520 further includes a hard disk drive 527 for reading from and writing to a hard disk (not shown), a magnetic disk drive 528 for reading from or writing to a removable magnetic disk 529, and an optical disk drive 530 for reading from or writing to a removable optical disk 531, such as a CD-ROM or other optical media. Hard disk drive 527, magnetic disk drive 528, and optical disk drive 530 are connected to system bus 523 by a hard disk drive interface 532, a magnetic disk drive interface 533, and an optical disk drive interface 534, respectively. The drives and their associated computer readable media provide nonvolatile storage of computer readable machine instructions, data structures, program modules, and other data for PC 520. Although the exemplary environment described herein employs a hard disk, removable magnetic disk 529, and removable optical disk 531, it will be appreciated by those skilled in the art that other types of computer readable media, which can store data and machine instructions that are accessible by a computer, such as magnetic cassettes, flash memory cards, digital video disks (DVDs), Bernoulli cartridges, RAMs, ROMs, and the like, may also be used in the exemplary operating environment.

A number of program modules may be stored on the hard disk, magnetic disk 529, optical disk 531, ROM 524, or RAM 525, including an operating system 535, one or more application programs 536, other program modules 537, and program data 538. A user may enter commands and information into PC 520, and provide control input through input devices such as a keyboard 540 and a pointing device 542. Pointing device 542 may include a mouse, stylus, wireless remote control, or other pointer. As used hereinafter, the term "mouse" is intended to encompass virtually any pointing device that is useful for controlling the position of a cursor on the screen. Other input devices (not shown) may include a microphone, joystick, haptic joystick, yoke, foot pedals, game pad, satellite dish, scanner, or the like. These and other input/output (I/O) devices are often connected to processing unit 521 through an I/O interface 546 that is coupled to the system bus 523. The term I/O interface is intended to encompass each interface specifically used for a serial port, a parallel port, a game port, a keyboard port, and/or a universal serial bus (USB). A monitor 547 or other type of display device is also connected to system bus 523 via an appropriate interface, such as a video adapter 548, and is usable to display application programs, graphic images relating to the display of gauges and other components inside an aircraft cockpit and to scenery and other objects outside the cockpit, Web pages, and/or other information. In addition to the monitor, PCs are often coupled to other peripheral output devices (not shown), such as speakers (through a sound card or other audio interface—not shown) and printers.

As indicated above, the invention may be practiced on a single machine, however, PC 520 can also operate in a networked environment using logical connections to one or more remote computers, such as a remote computer 549, to enable multi-player interaction while simulating flying an aircraft. Remote computer 549 may be another PC, a server (which is typically generally configured much like PC 520), a router, a network PC, a peer device, or a satellite or other common network node, and typically includes many or all of the elements described above in connection with PC 520, although only an external memory storage device 550 has been illustrated in FIG. 1. The logical connections depicted in FIG. 1 include a local area network (LAN) 551 and a wide area network (WAN) 552. Such networking environments are common in offices, enterprise wide computer networks, intranets, and the Internet.

When used in a LAN networking environment, PC 520 is connected to LAN 551 through a network interface or adapter 553. When used in a WAN networking environment, PC 520 typically includes a modem 554, or other means such as a cable modem, Digital Subscriber Line (DSL) interface, or an Integrated Service Digital Network (ISDN) interface for establishing communications over WAN 552, such as the Internet. Modem 554, which may be internal or external, is connected to the system bus 523 or coupled to the bus via I/O device interface 546; i.e., through a serial port. In a networked environment, program modules depicted relative to PC 520, or portions thereof, may be stored in the remote memory storage device. It will be appreciated that the network connections shown are exemplary and other means of establishing a communications link between the computers may be used, such as wireless communication and wide band network links. Other players coupled together over a communications network will typically use computing devices much like that described above.

Exemplary Preferred Embodiment

Figure 2:
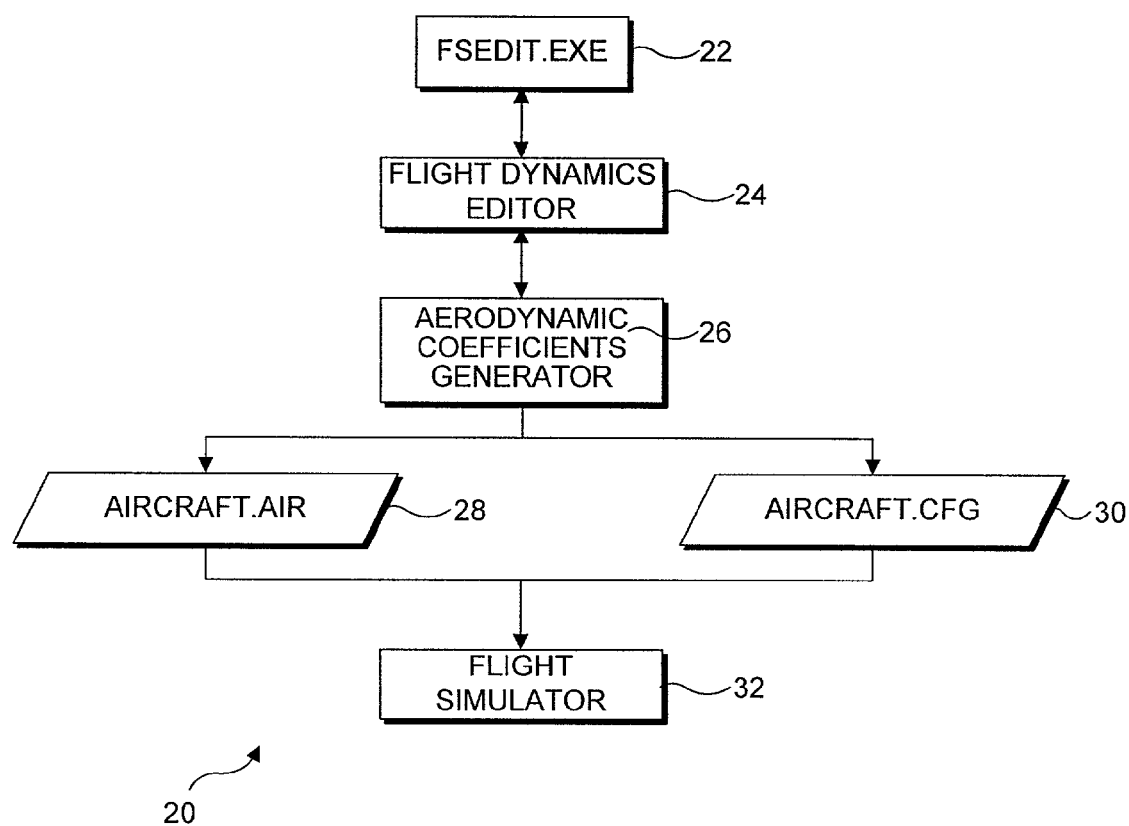
FIG. 2 is a block diagram showing the primary program modules used in implementing a preferred embodiment of the present invention.

As indicated above, the present invention is being used in Microsoft Corporation's FLIGHT SIMULATOR 2002™ program to enable users to modify existing aircraft designs and to create new aircraft designs which can then be evaluated by the user flying the aircraft using the flight simulation program. Several different modules are provided in the flight simulation program to allow this functionality. As shown in FIG. 2, a block diagram 20 illustrates these modules and indicates the specific flight model data program files that are produced to enable a user to evaluate or test the design of an aircraft as modified or created by the user. Parameters defining a particular aircraft design are modified using an editing program 22, which is identified as FSEDIT.EXE in this figure. Details of the various dialog boxes comprising a user interface for a flight dynamics editor 24 to enable input of the geometric properties are discussed below. If a user wants to modify an existing aircraft design, e.g., one of the aircraft provided with the flight simulator product, the user simply makes a copy of the aircraft data for the design, each of the aircraft having its own folder or directory in which the data are included. The copy of the aircraft design data can then be opened in the flight dynamics editor, enabling the user to change any of the parameters to create the modified design. A new design is created by choosing the "new" option under the file directory of the FSEDIT.EXE program and, after selected parameters have been input by the user, the new design is saved to its own folder under a user selected name that is different than that of any of the other aircraft designs.

Once a user has entered the parameters to modify an existing design or create a new design for an aircraft using flight dynamics editor 24, those parameters effecting the flight model characteristics are input to an aerodynamic coefficients generator module 26. Again, details of the aerodynamic coefficients generator module are disclosed below. The aerodynamic coefficients generator module 26 processes the input data and produces aerodynamic coefficients necessary to produce an accurate flight model for the aircraft design. To ensure compatibility, this process produces two data files including an aircraft.air data file 28 and an aircraft.cfg data file 30. The aircraft.air data file includes the aerodynamic coefficients for the aircraft while the aircraft.cfg file includes details relating to other aspects of the aircraft design that may not be directly related to the manner it which it flies, such as its control panel configuration. Note that the word aircraft in the aircraft.air file is generic and will be replaced with a word or phrase that identifies a specific design of aircraft. These two data files are used as input to a flight simulator module 32 to enable the user to experience the simulated flying of the aircraft design thus modified or created.

FIGS. 3A and 3B illustrate substantially more detail concerning the parameters that a user can specify using editing program 22. As shown in FIG. 3A, a flight dynamics editing (FDE) user interface wizard 36 is included to facilitate choice of different parameters by a user creating a new aircraft design. One of the first options that a user must specify is the purpose or type of aircraft being created, as indicated by a block 38. In accord with FIG. 3A, the user can select a design having a military purpose 40 and then choose among different types 42 of military aircraft, including a transport, a bomber, a fighter, a trainer, or a patrol aircraft. Alternatively, the user may specify a civilian type aircraft 44 and then choose among aircraft 46 having different purposes such as a sailplane, an ultralight, a homebuilt, a light, an agricultural, an amphibious, a business, a regional, a transport, a supersonic, or a NASA/X-aircraft. As those of ordinary skill will understand, each type of aircraft from which the user may select has a substantial impact upon the relative size of the aircraft and other basic aspects of its configuration.

The next option available to a user for input of parameters relates to engine layout 48. Under this category of input, the user can select from none, as indicated by a block 50, a piston engine option 52 having other parameters, including input specifying the number of engines, the type of aspiration, and a determination of whether the propeller pitch is fixed or variable, as indicated in block 54. If a piston engine is not selected, a user can choose a turboprop engine 56 and then select from the number of engines, and a fixed or variable type of turboprop, as indicated by options 58. Another type of engine that can be selected is a turbofan engine 60, and its associated parameter, which specifies the number of turbofan engines 62 included on the aircraft. Finally, the user might select a jet engine 64 and then specify the number of jet engines 66 that are included on the aircraft. As shown in FIG. 3B the third class of parameters selectable by a user, which is indicated in a box 68, is referred to as the empennage arrangement (i.e., the tail assembly of an aircraft). Accordingly, the user can select a canard 70 having several different options 72, or a vertical tail 74 having options 76, or a horizontal tail 78 having options 80.

The next category selectable by a user in defining the aircraft is indicated in a box 82 that is labeled wing definition. Three primary types of wings from which the user can select include a low-wing monoplane 84, a strut-braced high-wing 86, or a biplane 88. Each of these options can further be defined by parameters 90 wherein the user specifies whether the wings have spoilers, ailerons, and/or flaps and can also indicate the type of leading edge or trailing edge of the wings. Finally, the user can select the type of landing gear layout, as indicated in a box 92, providing the user the option of selecting between a tricycle landing gear 94 with an option 96 to specify whether the landing gear is retractable, or whether it is a conventional or tail dragger landing gear 98, which can also be retractable as indicated by an option 100. If designing a seaplane, the user can select floats 102 as the type of landing gear.

It should be noted that in addition to the user interface comprising flight dynamics editor 24, editing module 22 also includes a panel editor 112, a sound editor 114, and a texture editor 116, as illustrated by a block diagram 110 in FIG. 4. Panel editor 112 produces two data files in response to a user selection of input parameters defining the instrument panel or control panel on the aircraft, including a panel.cfg file 118, and a panel.bmp data file 120. Similarly, sound editor 114 produces two data files, including a sound.cfg data file 122, and a sound.wav data file 124. Texture editor 116 produces only a single data file, a texture.bmp file 126. Each of these data files are input to flight simulator program 32 for use in enabling the user to experience all aspects of flying the aircraft (i.e., not just the flight capabilities) that was modified or created by the user.

As noted above, the flight dynamics editor user interface facilitates entry by the user of each of the specific parameters that directly determine how the aircraft will fly, since most of these parameters are employed to generate the aerodynamic coefficients used to determine the flight model for the aircraft. Other of the parameters do not directly impact on how the aircraft flies in the flight simulator program. A relationship between the types of parameters that are input through the flight dynamics editor 24 and their inclusion in the two data files required by flight simulator program 32 to determine how the aircraft flies within the context of the flight simulator program are illustrated in a block diagram 130 in FIG. 5. In this block diagram, it will be noted that only specific blocks are input to aerodynamic coefficients generator module 26 for use in generating the aerodynamic coefficients for the aircraft being designed. A block 132 indicates that the user can input parameters related to the configuration of the aircraft, generally as discussed above. A block 134 provides that the user can also provide input of parameters relating to the controls of the aircraft, such as the elevator, ailerons, and rudder. A block 136 provides for input of parameters related to the flaps, while a block 138 enables the user to input parameters relating to the weight and balance of the aircraft design. Parameters relating to engine and fuel are input by the user, as indicated by blocks 140 and 142, respectively. Aerodynamic coefficients generator module 26 employs the input from the user or default settings or previously supplied settings of an existing aircraft design for each of these blocks in providing output for the aircraft.air data file and the aircraft.cfg data file. In addition, a block 144, which indicates that the user can input parameters relating to the landing gear, and a block 146, which provides for input of parameters relating to tuning of the aircraft, also are employed in producing the content of aircraft.air and aircraft.cfg data files 28 and 30. These two data files, which together comprise the flight model data for the aircraft, are then employed by flight simulator program 32 if the user chooses to evaluate the design of the aircraft by "flying" the aircraft with the flight simulation program.

As illustrated in a block diagram 150 in FIG. 6, aerodynamic coefficients generator module 26 carries out a substantial number of calculations to determine flight model data that will be used by the flight simulator program when the aircraft that was designed or modified is flown. The data are divided among a number of different parameters and aerodynamic coefficients. Static design parameters 152 include default parameters that are based upon properties determined as a function of the parameters input by the user, including wing properties, atmospheric properties, tail properties, fuselage properties, weight and center of gravity properties, and moment of inertia properties. The aerodynamic coefficients are divided into several different categories, including lift coefficients 154, drag coefficients 156, pitching moment coefficients 158, rolling moment coefficients 160, yawing moment coefficients 162, and side force coefficients 164. Module 26 generally uses well known classical techniques for generating each of the aerodynamic coefficients in these different categories, applying the same formulas that are typically employed in designing actual aircraft. Details of the calculations carried out by the module need not be discussed herein, since they are generally well known to those of ordinary skill in the art.

FIG. 6 lists each of the aerodynamic coefficients that are determined in associated with the terms typically applied in the art for these coefficients. For example, those of ordinary skill will appreciate that aerodynamic coefficients in categories 160, 162, and 164 generally comprise lateral directional coefficients in flight model data and will readily be understood by aircraft designers. Each of these aerodynamic coefficients determines a different aspect of a particular aircraft design. For example, under category 154, which pertains to lift coefficients, the lift, L, due to flaps, which is typically identified by the variable name CLflaps, can be determined by the following equation:

$$L = \frac{1}{2}\rho V^2 C_L S$$

And the Coefficient of Lift, $C_L$ is then given by:

$$C_L = 2 * \text{Lift}/\rho V^2 S$$

where:
S=Wing Area (square feet)
V=Stall Speed (feet/second)
$\rho$=Density (slugs/ft$^3$)
Lift=Max Gross Weight (pounds)

The change in lift coefficient due to flaps is then directly proportional to the square of the change in stall speed from the flaps up to the flaps down condition, as defined by:

$$C_{Lflap} = \Delta C_L = C_{Lflaps\text{-}down} - C_{Lflaps\text{-}up}$$

This example illustrates one of the more simple cases for determining aerodynamic coefficients and has been chosen for its relative simplicity. The equations employed to determine stability derivatives for coefficients are substantially more complicated, particularly in the lateral direction, for categories 160, 162, and 164.

It should also be noted that the aerodynamic coefficients have to be calculated in a particular order, since many of the variables are dependent on the results from generating other aerodynamic coefficients. This relationship is known as "cross coupling," since a change in one flight characteristic of an aircraft design frequently results in a change in one or more other flight characteristics. For example, the airplane lift curve slope, $CL_\alpha$, must be generated before the static longitudinal stability, $CM_\alpha$, can be determined. Accordingly, aerodynamic coefficients generator module 26 is a relatively complex module that takes into consideration all of the inter dependencies that may affect the outcome of the aerodynamic coefficient generation. While the relationship of these aerodynamic coefficients are well known to those of ordinary skill in the art of aircraft design and need not be explicitly set forth herein, the following list identifies some of these interdependencies:

$C_{L\alpha} = f(C_{L\alpha\text{-}wing}, C_{L\alpha\text{-}horizontal\ tail})$
$C_{Lih} = f(C_{L\alpha})$
$C_{Lde} = f(C_{Lih})$
$C_{Mih} = f(C_{L\alpha})$
$CMde = f(C_{Mih})$
$C_{Lq} = f(C_{L\alpha})$
$C_{L\alpha dot} = f(C_{L\alpha})$
$C_{M\alpha dot} = f(C_{L\alpha dot})$
$C_{Mq} = f(C_{L\alpha})$
$C_{M\alpha} = f(C_{L\alpha})$
$C_{Y\beta} = f(C_{L\alpha})$
$C_{Yp} = f(C_{Y\beta})$
$C_{Yr} = f(C_{Y\beta})$
$C_{l\beta} = f(C_{L\alpha})$
$C_{lp} = f(C_{L\alpha})$
$C_{lr} = f(C_{L\alpha}, C_{Y\beta})$
$C_{n\beta} = f(C_{Y\beta})$
$C_{np} = f(C_{L\alpha}, C_{Y\beta})$
$C_{nr} = f(C_{Y\beta})$ The above list is by no means intended to be complete, and the dependencies given are only in regard to the interdependencies between aerodynamic coefficients, not the dependence of the variables on other parameters (e.g., geometric locations, atmospheric properties, etc.).

Once the aerodynamic coefficients have been determined by the aerodynamic coefficients generator module, a modification is applied, based upon empirical data determined by use of the flight simulator program and joystick interface to fly aircraft designs of known flight characteristics. In essence, certain of the calculated aerodynamic coefficients are "tweaked," essentially by applying an empirically determined scaling factor so that the results more closely and more accurately reflect the way that a true aircraft would feel like when flying. The empirical determination of the scaling factor applied to certain of the aerodynamic coefficients is relatively subjective and may be considered optional, since it has minimal impact upon the results that would be experienced by a user who is not very knowledgeable and experienced in actually flying aircraft of specific designs. However, this tweaking step adds to the accuracy for simulating the flight of an aircraft design based upon the inventor's own experience and the empirical data available relating to certain of a known aircraft's handling qualities. The intent is simply to account for any inconsistencies between what classical aerodynamic theory indicates the aerodynamic coefficients should be and the manner in which the aircraft design actually responds within the simulation program when those aerodynamic coefficients are used in the flight model data.

Flight dynamics editor 24 provides a relatively rich opportunity for a user to provide input of parameters in the various categories noted above when designing or modifying the existing design of an aircraft. FIGS. 7 through 17 provide examples of the various dialogs that are included in flight dynamics editor 24. For example, as shown in FIG. 7, a dialog 300 is displayed by the flight dynamics editor to enable a user to provide input of parameters defining the configuration of an aircraft design. This and each of the other dialogs that are discussed below include a menu line 302, and a button bar 304, each of which provide typical options for interacting with the dialog. A directory tree 306 indicates the storage location for the input parameters provided by the user and of other files in the storage. A number of parameters can be input in a section 308 of the dialog for specifying the wing geometry. Values shown for these parameters in the dialog of FIG. 7 (and dialog shown in the other Figures discussed below) are simply exemplary and are not intended to be in anyway limiting.

When a user selects a particular parameter and makes a change or an entry to it for input, the flight dynamics editor program determines if the input is within an acceptable range. An acceptable input is determined based upon predefined criteria for selected parameters. For example, it may be inappropriate to enter a negative value for certain parameters if negative values for those parameters have no physical meaning. In other cases, upper or lower limit may be predefined for a given parameter to preclude the user from entering a value that would be unacceptable in aircraft design. If the user attempts to input a value that is outside these predefined limits, the user will be prompted to modify the input before continuing. The configuration dialog also includes a region 310 for entering reference datum that specify the longitudinal, lateral, and vertical position from a visual model origin of the aircraft, i.e., a reference point within the three dimensional (3D) space comprising the aircraft. A region 312 is also provided in the dialog for entering parameters related to the tail geometry of the aircraft, including parameters for a horizontal tail, a canard, or a vertical tail.

In FIG. 8, a dialog 320 is provided for entering parameters relating to the controls on an aircraft design. In this dialog, a region 322 includes several parameters for specifying the elevator of the aircraft, while a region 324 enables input of parameters for the aileron. Also included are parameters for a rudder in a region 326 and for a spoiler in a region 328.

The parameters that can be input when designing an aircraft to determine the characteristics of the flaps are illustrated in a dialog 330 shown in FIG. 9. In this Figure, a control button 332 enables a user to add a flap set, while a control button 334 enables a user to delete a flap set previously added. Since more than one flap set can be included, a flap set selector list box 336 enables the user to select any flap set that is provided for the aircraft. In a region 338 in this dialog, a number of other parameters can be set by the user, in regard to the type of flap, the flap system, various scalar values, and the flap handle index to deflection mapping. Also, in a region 340, the user can input a speed for design cruising, flap up stall, and flap down stall, in knots.

FIG. 10 illustrates a dialog 350 for the weight and balance parameters that can be input by a user. A region 352 enables the user to input the maximum design gross weight for the aircraft. In a region 354 the user can define the empty weight in pounds and also indicate the center of gravity for the empty weight condition of the aircraft relative to the reference datum. A region 356 comprises a payload weight editor that enables the user to add or delete a station load, and for a selected load, input the weight and relative position in regard to the reference datum. A region 358 includes text boxes in which the user can enter the moment of inertia for the empty weight condition in terms of pitch, roll, and yaw, as well as the empty weight coupled moment of inertia in slugs-square feet. In addition, the program will calculate an estimated moment of inertia value as a reference for the user to use when choosing values to input and is based on the weight and location of the empty aircraft.

A dialog 360 for entry of piston engine parameters is included in FIG. 11. A region 362 provides for entry of various parameters for the piston engine, including cylinder displacement, compression ratio, number of cylinders, maximum rated revolutions per minute, horsepower, cooling type, and carburetor type. A region 364 provides for entry of turbocharger properties (if the piston engine includes a turbocharger). In a region 366, a user can indicate an engine position relative to the reference datum, for each engine specified.

FIG. 12 enables entry of propeller parameters in a dialog 370. In a region 372 of the dialog, the user can specify the propeller diameter, the number of blades, the propeller moment of inertia, maximum/minimum pitch angle, fixed pitch angle, minimum governed revolutions per minute, and a gear reduction ratio. Check boxes are provided for indicating whether propeller synchronization, propeller deicing, or propeller reverse capability is available on the aircraft. A region 374 in the dialog enables the user to enter propeller feathering properties, if desired in the design being created.

FIG. 13 illustrates a dialog 380 for input of turboprop parameters, including a maximum torque in a region 382, and turbine properties in a region 384. The user can specify the number of turboprop engines and the relative position in regard to the reference datum in a region 386.

In FIG. 14, a dialog 390 displays the parameters that a user can specify for a jet engine. In a region 392, the user can specify static thrust in pounds, inlet area, rated revolutions per minute, and a scalar for fuel flow. In addition, two check boxes are provided to indicate respectively whether an afterburner is included, and whether a thrust reverser is included on the jet engine. A region 394 enables input of parameters relating to the number of engines and the relative position of each engine in regard to the reference datum.

A dialog 400, which is shown in FIG. 15, displays the parameters than can be entered by a user in configuring the fuel system of an aircraft. These parameters which are shown in a region 402 enable the user to specify the relative position of each fuel tank on the aircraft, in regard to the reference datum, a total capacity of each tank, and an unusable capacity for each tank.

FIG. 16 illustrates a dialog 410 that is provided to enable the user to configure the landing gear of the aircraft. The top part of the dialog includes an add point control 412 and a delete point control 414 for each landing gear point of contact with the ground. From among the points that have been added, a user can select a point in a list box 416 to edit the properties of the point. These properties are configured in a region 418. Specifically, a user can identify the class of a selected point, indicate whether the landing gear (wheel) at that point has a brake, and also specify the sound that will be heard upon take off and landing, relative to the point. The position of the point in regard to the reference datum can also be specified by the user. Various other parameters, including a damage threshold, a wheel radius (if applicable), a steerage angle, static compression, maximum/static compression ratio, a damping ratio, and if applicable, the extension time and retraction time can also be provided as input by the user. At the bottom of the dialog, a text entry box 420 is provided for input of the static pitch angle and a text entry box 422 for entry of the static center of gravity height above ground, for the aircraft.

Finally, in FIG. 17, a dialog 430 includes a region 432 for selectively tuning a number of parameters of the aircraft design, using slider controls. These slider controls enable the user to set scalar values for fine tuning a number of different parameters. In this dialog, the user can vary the pitch, roll, and yaw stability, control parasitic or induced drag, and modify the effectiveness of the elevator, aileron, rudder, elevator trim, aileron trim, and rudder trim.

After the user has entered or modified parameters defining the design of the aircraft through the flight dynamics editor user interface, aerodynamic coefficients generator module 26 generates the corresponding aerodynamic coefficients for the aircraft in response to the user's input. As noted above, not all of the parameters entered by the user directly impact upon the generation of aerodynamic coefficients. These aerodynamic coefficients are then applied to the two flight model data files employed by Microsoft Corporation's FLIGHT SIMULATOR 2002 to enable the user to then fly the aircraft as designed or modified.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A method for enabling a user to create or modify a design for an aircraft and evaluate flight characteristics of the design, comprising the steps of:
   (a) enabling the user to input a plurality of parameters that define the design of the aircraft;
   (b) processing the plurality of parameters to generate a plurality of aerodynamic coefficients that define a flight model for the design of the aircraft;
   (c) producing a plurality of flight model data files that are compatible with a flight simulation program, the plurality of flight model data files including:
      (i) the aerodynamic coefficients generated; and
      (ii) selected parameters input by the user; and
   (d) subsequently, enabling the user to evaluate the flight characteristics results of the design in real-time by interactive, simulated flying of the aircraft as represented in graphic images on a display, within a flight simulation program, using the plurality of flight model data files, wherein said interactive, simulated flying of the aircraft enables the user's evaluation to be substantially based on a point of view of a pilot flying the aircraft.

2. The method of claim 1, wherein the plurality of parameters include geometric properties of the aircraft, and wherein the step of processing comprises the step of using the geometric properties to determine a force developed by each of a plurality of component surfaces of the aircraft.

3. The method of claim 1, wherein the step of enabling the user to input the plurality of parameters comprises the steps of:
   (a) associating allowed limits for at least some of the plurality of parameters; and
   (b) providing an indication if the user enters a parameter that is outside the allowed limits associated with said parameter.

4. The method of claim 3, further comprising the step of excluding entry of any parameter that is outside the allowed limits associated with said parameter.

5. The method of claim 1, further comprising the steps of:
   (a) enabling the user to modify at least one of a plurality of parameters of an existing design for an aircraft; and
   (b) repeating steps (b) through (d) in claim 1 in regard to the design of the existing aircraft as thus modified by the user, to enable the user to evaluate flight characteristics of the design of the existing aircraft as thus modified by the user.

6. The method of claim 1, further comprising the step of modifying the flight model data files that were generated, based upon empirical data determined from use of the flight simulation program, to increase an accuracy of the flight characteristics experienced when simulating flying of the aircraft in the flight simulation program.

7. The method of claim 1, wherein the step of producing the flight model data files includes the step of producing one flight model data file that includes binary data defining the aerodynamic coefficients for a plurality of component surfaces of the aircraft.

8. The method of claim 1, wherein the step of producing the flight model data files includes the step of producing one flight model data file that includes at least some of the plurality of parameters input by the user that do not directly affect the flight characteristics of the aircraft.

9. The method of claim 8, wherein said one flight model data file defines at least one of:
   (a) an instrument panel configuration for the aircraft; and
   (b) a plurality of sounds experienced when simulating flying of the aircraft.

10. The method of claim 1, wherein the step of processing the plurality of parameters comprises the steps of:
   (a) determining an order in which the aerodynamic coefficients for specific component surfaces of the aircraft are generated; and
   (b) generating the aerodynamic coefficients for the component surfaces in the order determined.

11. A computer-implemented memory medium, on which are stored machine instructions that when executed carry out the steps of claim 1.

12. A method for enabling a user to create or modify a design for an aircraft and evaluate flight characteristics of the design as created or modified by the user, comprising the steps of:
   (a) enabling the user to input a plurality of parameters that define the design of the aircraft;
   (b) processing the plurality of parameters to generate a plurality of aerodynamic coefficients in a predefined sequence, said predefined sequence being selected to ensure that any aerodynamic coefficients required to generate other aerodynamic coefficients of component surfaces are generated first, said aerodynamic coefficients being generated to define a flight model for the design of the aircraft;

(c) producing a plurality of flight model data files that include flight model data in a format that is compatible with a selected flight simulation program; and (d) subsequently, enabling the user to evaluate the flight characteristics results of the design in real-time by interactively simulating flying of the aircraft using the selected flight simulation program, as represented in graphic images on a display, said flight simulation program using the flight model data files, wherein said interactively, simulated flying of the aircraft enables the user's evaluation to be substantially based on a point of view of a pilot flying the aircraft.

13. The method of claim 12, wherein the step of producing the flight model data comprises the step of producing a binary flight model data file that includes the aerodynamic coefficients for the aircraft and an environmental flight model data file that includes at least one of:

(a) a control panel configuration; and (b) a set of sounds experienced by the user while simulating flying of the aircraft with the flight simulation program.

14. The method of claim 12, further comprising the steps of:

(a) enabling the user to modify a plurality of parameters for an existing aircraft design; and (b) carrying out steps (b) through (d) in claim 12 for the existing aircraft design as thus modified.

15. The method of claim 12, further comprising the steps of:

(a) associating allowed limits for at least some of the plurality of parameters; and (b) excluding entry of any parameter that is outside the allowed limits associated with said parameter.

16. The method of claim 12, further comprising the step of modifying the flight model data that was generated, based upon empirical data determined from use of the flight simulation program, to increase an accuracy of the flight characteristics experienced when simulating flying of the aircraft in the flight simulation program.

17. The method of claim 12, wherein an aerodynamic coefficient for aircraft lift curve slope is generated before an aerodynamic coefficient for static longitudinal stability.

18. A computer-implemented memory medium, on which are stored machine instructions that when executed carry out the steps of claim 12.

19. A system for enabling a user to create or modify a design for an aircraft and evaluate flight characteristics of the design, comprising:

(a) a memory in which are stored machine instructions that define a plurality of functions;

(b) a display;

(c) a user input device for input of data, commands, and for controlling the aircraft; and (d) a processor that is coupled to the memory, the display, and the user input device, said processor executing the machine instructions to carry out the plurality of functions, including:

(i) enabling the user to input a plurality of parameters that define the design of the aircraft through the input device;

(ii) processing the plurality of parameters to generate a plurality of aerodynamic coefficients that define a flight model for the design of the aircraft;

(iii) producing a plurality of flight model data files that are compatible with a flight simulation program and that include the aerodynamic coefficients generated and selected parameters input by the user; and (iv) subsequently, enabling a user to evaluate the flight characteristics results of the design in real-time by simulating flying of the aircraft in the flight simulation program interactively as represented in graphic images on the display, responsive to controls and commands provided by the user with the input device, wherein the flight characteristics of the design simulated during flying are based upon the plurality of flight model data files.

20. The system of claim 19, wherein the plurality of parameters include geometric properties of the aircraft, and wherein the processor uses the geometric properties to determine a force developed by each of a plurality of component surfaces of the aircraft.

21. The system of claim 19, wherein the machine instructions cause the processor to:

(a) associate allowed limits for at least some of the plurality of parameters; and (b) provide an indication if a user enters a parameter that is outside the allowed limits associated with said parameter.

22. The system of claim 21, wherein the machine instructions cause the processor to refuse entry of any parameter that is outside the allowed limits associated with said parameter.

23. The system of claim 19, wherein the machine instructions further cause the processor to:

(a) enable a user to modify at least one of a plurality of parameters of an existing design for an aircraft; and (b) repeat steps (b) through (d) in claim 19 in regard to the design of the existing aircraft as thus modified by the user, to enable the user to evaluate flight characteristics of the design of the existing aircraft as thus modified by the user.

24. The system of claim 19, wherein the machine instructions further cause the processor to modify the flight model data files that were generated, based upon empirical data determined for flight simulation, to increase an accuracy of the flight characteristics experienced when simulating flying of the aircraft.

25. The system of claim 19, wherein the machine instructions cause the processor to produce one flight model data file that includes binary data defining the aerodynamic coefficients for a plurality of component surfaces of the aircraft.

26. The system of claim 19, wherein the machine instructions cause the processor to produce one flight model data file that includes at least some of the plurality of parameters input by a user that do not directly affect the flight characteristics of the aircraft.

27. The system of claim 26, wherein said one flight model data file defines at least one of:

(a) an instrument panel configuration for the aircraft; and (b) a plurality of sounds experienced when simulating flying of the aircraft.

28. The system of claim 19, wherein the machine instructions cause the processor to:
  (a) determine an order in which the aerodynamic coefficients for specific component surfaces of the aircraft are generated; and
  (b) generate the aerodynamic coefficients for the component surfaces in the order thus determined.

29. A system for enabling a user to create or modify a design for an aircraft and evaluate flight characteristics of the design, comprising:
  (a) a memory in which are stored machine instructions that define a plurality of functions;
  (b) a display;
  (c) a user input device for input of data, commands, and for controlling the aircraft; and
  (d) a processor that is coupled to the memory, the display, and the user input device, said processor executing the machine instructions to carry out the plurality of functions, including:
    (i) enabling the user to input a plurality of parameters with the user input device, to define the design of the aircraft;
    (ii) processing the plurality of parameters to generate a plurality of aerodynamic coefficients in a predefined sequence, said predefined sequence being selected to ensure that any aerodynamic coefficients required to generate other aerodynamic coefficients of component surfaces are generated first, said aerodynamic coefficients being generated to define a flight model for the design of the aircraft;
    (iii) producing flight model data files of flight model data in a format compatible with a flight simulation program; and
    (iv) enabling the user to evaluate the flight characteristics results of the design in real-time by simulating flying of the aircraft interactively as represented in graphic images on the display and controls and commands provided with the input device, using the flight model data in the flight simulator program.

30. The system of claim 29, wherein the machine instructions cause the processor to produce a binary flight model data file that includes the aerodynamic coefficients for the aircraft and an environmental flight model data file that includes at least one of:
  (a) a control panel configuration; and
  (b) a set of sounds experienced by the user while simulating flying of the aircraft.

31. The system of claim 29, wherein the machine instructions further cause the processor to:
  (a) enable a user to modify a plurality of parameters for an existing aircraft design; and
  (b) carry out steps (b) through (d) in claim 29 for the existing aircraft design as thus modified.

32. The system of claim 29, wherein the machine instructions further cause the processor to:
  (a) associate allowed limits with at least some of the plurality of parameters; and
  (b) exclude entry of any parameter that is outside the allowed limits associated with said parameter.

33. The system of claim 29, wherein the machine instructions further cause the processor to modify the flight model data that was generated, based upon empirical data determined from other simulated flying, to increase an accuracy of the flight characteristics experienced when simulating flying of the aircraft.

34. The system of claim 29, wherein an aerodynamic coefficient for aircraft lift curve slope is generated before an aerodynamic coefficient for static longitudinal stability.

* * * * *